United States Patent
Shih et al.

(10) Patent No.: US 11,031,274 B2
(45) Date of Patent: Jun. 8, 2021

(54) SEMICONDUCTOR DEVICE PACKAGES AND METHOD FOR MANUFACTURING THE SAME

(71) Applicant: Advanced Semiconductor Engineering, Inc., Kaohsiung (TW)

(72) Inventors: Yu-Lin Shih, Kaohsiung (TW); Chih-Cheng Lee, Kaohsiung (TW)

(73) Assignee: ADVANCED SEMICONDUCTOR ENGINEERING, INC.

( * ) Notice: Subject to any disclaimer, the term of this patent is extended or adjusted under 35 U.S.C. 154(b) by 0 days.

(21) Appl. No.: 16/578,062

(22) Filed: Sep. 20, 2019

(65) Prior Publication Data
US 2021/0090931 A1 Mar. 25, 2021

(51) Int. Cl.
| | |
|---|---|
| *H01L 21/48* | (2006.01) |
| *H01L 21/56* | (2006.01) |
| *H01L 21/683* | (2006.01) |
| *H01L 21/78* | (2006.01) |
| *H01L 23/31* | (2006.01) |
| *H01L 23/538* | (2006.01) |
| *H01L 23/00* | (2006.01) |

(52) U.S. Cl.
CPC ...... *H01L 21/6835* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/78* (2013.01); *H01L 23/3128* (2013.01); *H01L 23/5383* (2013.01); *H01L 23/5386* (2013.01); *H01L 24/16* (2013.01); *H01L 2221/68372* (2013.01); *H01L 2224/16157* (2013.01); *H01L 2924/35121* (2013.01)

(58) Field of Classification Search
CPC ............. H01L 21/6835; H01L 21/4853; H01L 21/4857; H01L 21/563; H01L 21/565; H01L 21/568; H01L 21/78; H01L 23/3128; H01L 23/5383; H01L 23/5386; H01L 24/16; H01L 2221/68372; H01L 2224/16157; H01L 2924/35121
USPC ........................................................ 257/668
See application file for complete search history.

(56) References Cited

U.S. PATENT DOCUMENTS

| | | | |
|---|---|---|---|
| 9,997,447 B1* | 6/2018 | Chen | H01F 17/0006 |
| 2015/0084206 A1* | 3/2015 | Lin | H01L 23/5389 257/774 |
| 2018/0160546 A1* | 6/2018 | Ori | H05K 3/007 |

* cited by examiner

*Primary Examiner* — Tong-Ho Kim
(74) *Attorney, Agent, or Firm* — Foley & Lardner LLP

(57) ABSTRACT

A semiconductor device package includes a carrier, a patterned passivation layer and a first patterned conductive layer. The patterned passivation layer is disposed on the carrier. The first patterned conductive layer is disposed on the carrier and surrounded by the patterned passivation layer. The first patterned conductive layer has a first portion and a second portion electrically disconnected from the first portion. The first portion has a first surface adjacent to the carrier and exposed by the patterned passivation layer. The second portion has a first surface adjacent to the carrier exposed by the patterned passivation layer. The first surface of the first portion is in direct contact with an insulation medium.

45 Claims, 37 Drawing Sheets

SEMICONDUCTOR DEVICE PACKAGES AND METHOD FOR MANUFACTURING THE SAME

BACKGROUND

1. Field of the Disclosure

The present disclosure relates to semiconductor device packages, and more particular to semiconductor device packages and methods thereof manufacturing the same.

2. Description of the Related Art

A semiconductor device package can include a redistribution layer (RDL) structure and some semiconductor device disposed on the RDL structure. A consecutive seed layer or a consecutive conductive layer is included to form the RDL structure.

Electrical test(s) on the RFL structure (e.g. input/output (I/O)) is also performed, which can be done when the consecutive seed layer is removed. If the seed layer is removed subsequent to the formation of the semiconductor device package, the whole semiconductor device package (which include relatively expensive semiconductor device (s)), which does not pass the test, could be discarded.

In order to save the cost or reduce quantity of discarded semiconductor device package(s), the seed layer can be removed once the bottom patterned conductive layer of the RDL structure is formed. However, the bottom patterned conductive layer of the RDL structure may have relatively less bonding to the carrier for handling the manufacturing of the semiconductor device package, which can result in delamination, peeling or other issues.

SUMMARY

In some embodiments, the present disclosure provides a semiconductor device package. The semiconductor device package includes a carrier, a patterned passivation layer and a first patterned conductive layer. The patterned passivation layer is disposed on the carrier. The first patterned conductive layer is disposed on the carrier and surrounded by the patterned passivation layer. The first patterned conductive layer has a first portion and a second portion electrically disconnected from the first portion. The first portion has a first surface adjacent to the carrier and exposed by the patterned passivation layer. The second portion has a first surface adjacent to the carrier exposed by the patterned passivation layer. The first surface of the first portion is in direct contact with an insulation medium.

In some embodiments, the present disclosure provides a method of manufacturing a method of manufacturing a semiconductor device package. The method includes providing a carrier, forming a conductive layer on the carrier, forming a patterned passivation layer on the conductive layer, and forming a first patterned conductive layer surrounded by the patterned passivation layer. The first patterned conductive layer has a first portion and a second portion electrically disconnected from the first portion. The first portion has a first surface adjacent to the carrier and exposed by the patterned passivation layer. The second portion has a first surface adjacent to the carrier exposed by the patterned passivation layer. The method further includes making the first surface of the first portion in direct contact with an insulation medium.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Figure 1:
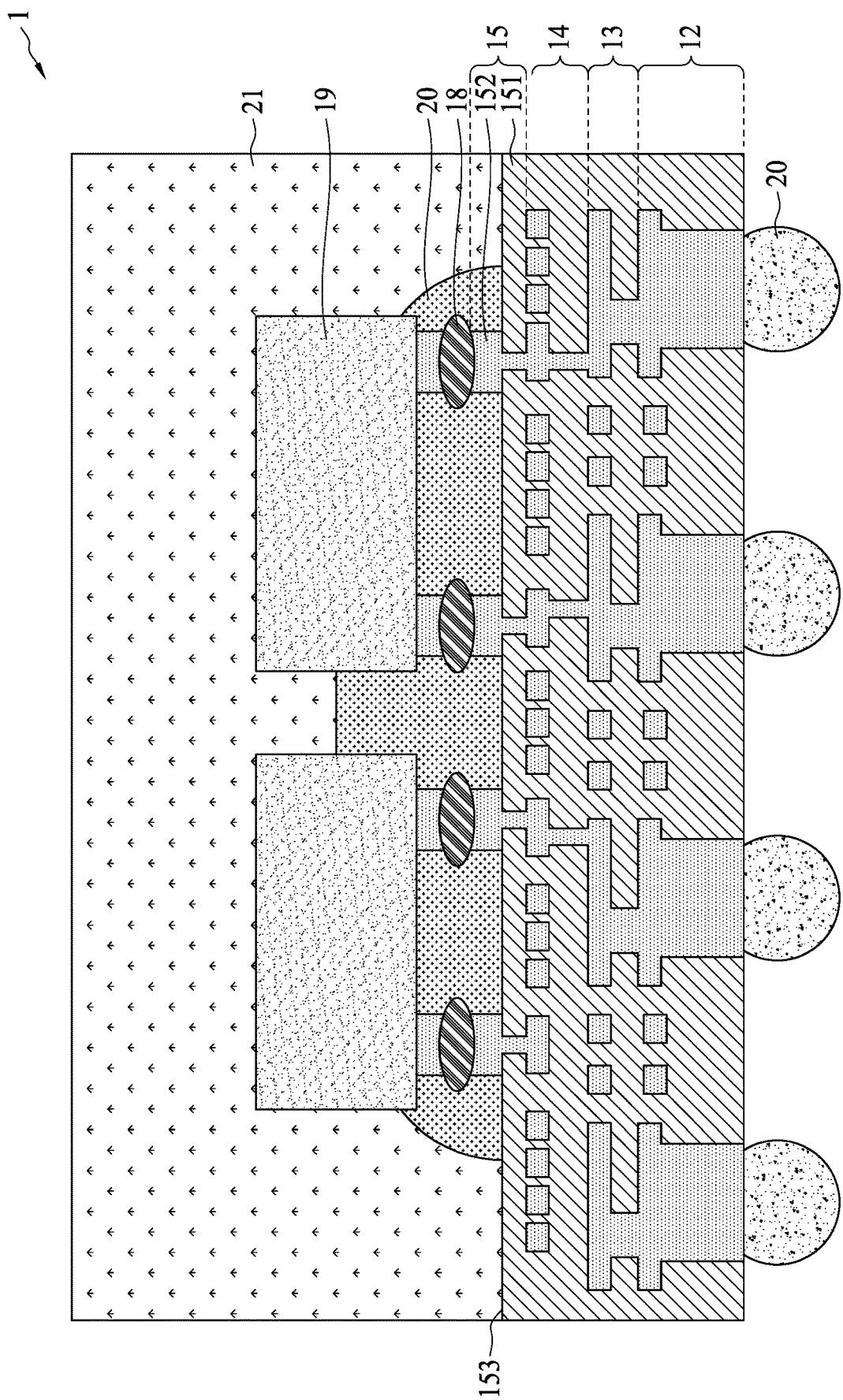
FIG. 1 illustrates a cross-sectional view of a semiconductor device package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

To meet the specification of increasing I/O counts, a number of dielectric layers of a substrate should increase. In some comparative embodiments, a manufacturing process of a core substrate may include the following stages. Firstly, a core with two copper foils disposed on two sides thereof is provided. Then, a plurality of dielectric layers and a plurality of circuit layers are formed or stacked on the two copper foils. One circuit layer may be embedded in one corresponding dielectric layer. Therefore, the core substrate may include a plurality of stacked dielectric layers and a plurality of circuit layers embedded in the dielectric layers on both sides of the core. Since a line width/line space (L/S) of the circuit layers of such core substrate may be greater than or equal to 10 micrometers (µm)/10 µm, the number of the dielectric layers of such core substrate is relatively large. Although the manufacturing cost of such core substrate is relatively low, the manufacturing yield for the circuit layers and the dielectric layers of such core substrate is also relatively low, and, thus, the yield of such core substrate is relatively low.

At least some embodiments of the present disclosure provide for a wiring structure which has an advantageous compromise of yield and manufacturing cost. At least some embodiments of the present disclosure further provide for techniques for manufacturing the wiring structure.

FIG. 1 illustrates a cross-sectional view of a semiconductor device package 1 according to some embodiments of the present disclosure.

Referring to FIG. 1, the semiconductor device package 1 includes a redistribution layer (RDL) 12. A redistribution layer 13 is formed on the redistribution layer 12. A redistribution layer 14 is formed on the redistribution layer 13. A redistribution layer 15 is formed on the redistribution layer 14. The redistribution layer 15 includes a passivation layer 151 and a conductive layer 152. A surface 153 is between the passivation layer 151 and the conductive layer 152. A bump material 18 is formed on the conductive layer 152 of the redistribution layer 15. A semiconductor device 19 is electrically connected to the bump material 18. An underfill 20 is formed on the surface 153 of the redistribution layer 15. The underfill 20 encapsulates the conductive layer 152. The underfill 20 encapsulates the bump material 18. The underfill 20 is formed between the surface 153 and semiconductor device 19. An encapsulant 21 encapsulates the semiconductor device 19 and the underfill 20 on the surface 153.

FIG. 1A, FIG. 1B, FIG. 1C, FIG. 1D, FIG. 1E, FIG. 1F, FIG. 1G, FIG. 1H, FIG. 1I, FIG. 1J, FIG. 1K and FIG. 1L illustrate a method of manufacturing a semiconductor device package at various stages according to some embodiments of the present disclosure.

Figure 1A:
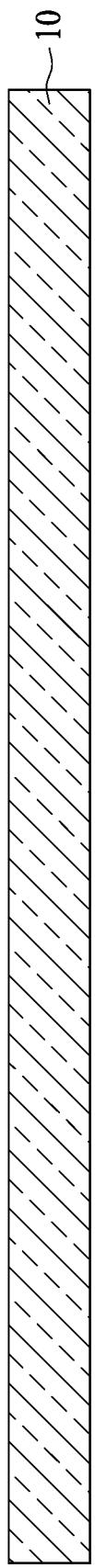
FIG. 1A, FIG. 1B, FIG. 1C, FIG. 1D, FIG. 1E, FIG. 1F, FIG. 1G, FIG. 1H, FIG. 1I.

Referring to FIG. 1A, a carrier 10 is provided.

Figure 1B:
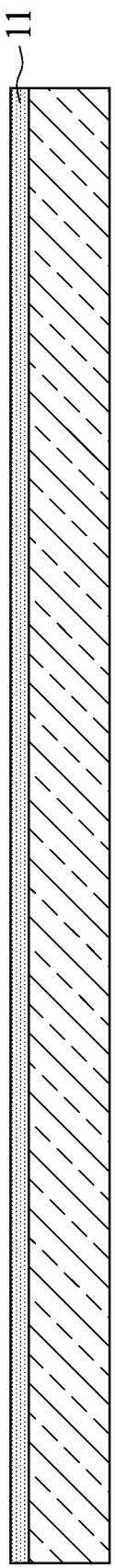

Referring to FIG. 1B, a conductive layer 11 is disposed on the carrier 10. The conductive layer 11 can include one or more layers. The conductive layer 11 includes copper. The conductive layer 11 can include copper and titanium (not shown). Because the titanium provides better adhesion than copper, the titanium is formed between the carrier 10 and copper.

Figure 1C:
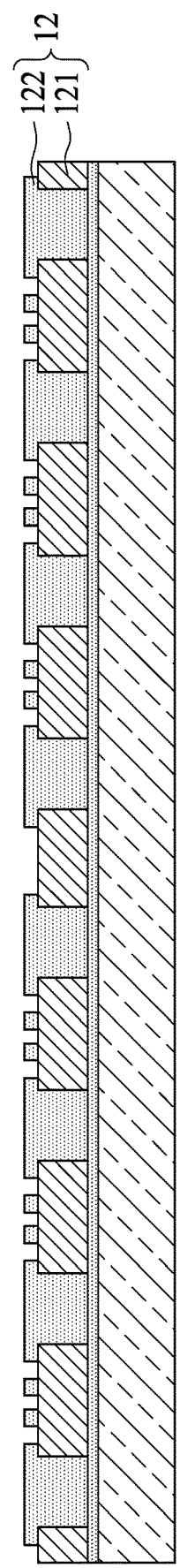

Referring to FIG. 1C, a RDL 12 is disposed on the conductive layer 11. The RDL 12 includes a passivation layer 121 and a conductive layer 122. The passivation layer 121 is patterned. The conductive layer 122 is patterned. The conductive layer 122 is surrounded by the passivation layer 121.

Figure 1D:
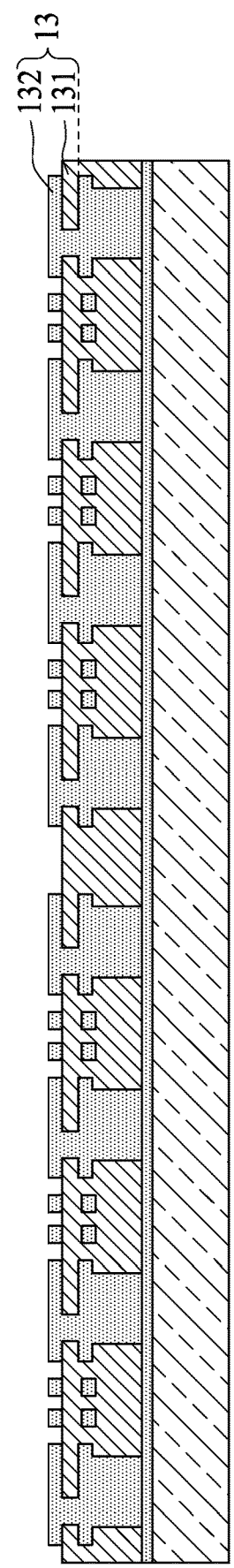

Referring to FIG. 1D, a RDL 13 is disposed on the RDL 12. The RDL 13 includes a passivation layer 131 and a conductive layer 132. The passivation layer 131 is patterned. The conductive layer 132 is patterned. The conductive layer 132 is surrounded by the passivation layer 131.

Figure 1E:
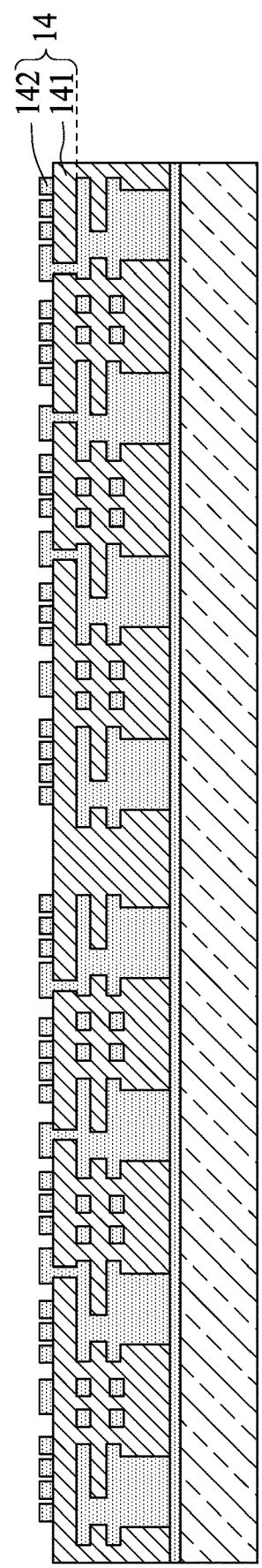

Referring to FIG. 1E, a RDL 14 is disposed on the RDL 13. The RDL 14 includes a passivation layer 141 and a conductive layer 142. The passivation layer 141 is patterned. The conductive layer 142 is patterned. The conductive layer 142 is surrounded by the passivation layer 141.

Figure 1F:
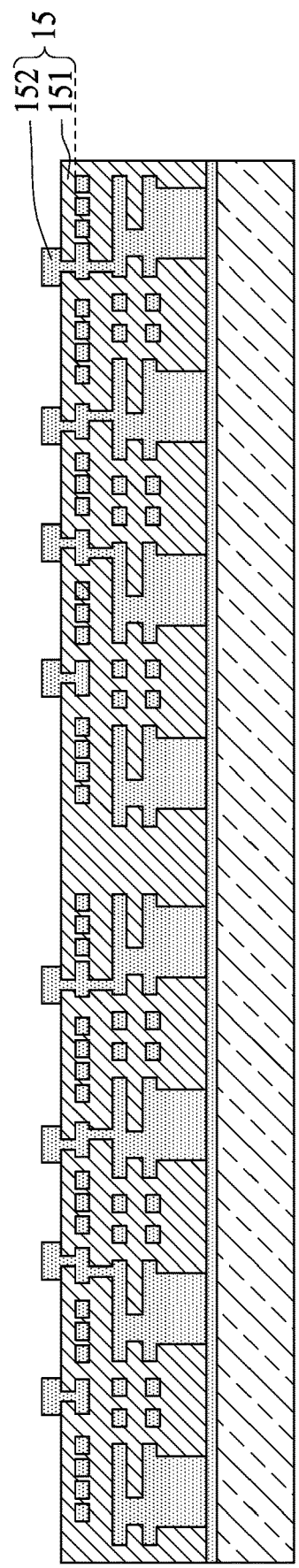

Referring to FIG. 1F, a RDL 15 is disposed on the RDL 14. The RDL 15 includes a passivation layer 151 and a conductive layer 152. The passivation layer 151 is patterned. The conductive layer 152 is patterned. The conductive layer 152 is surrounded by the passivation layer 151.

Figure 1G:
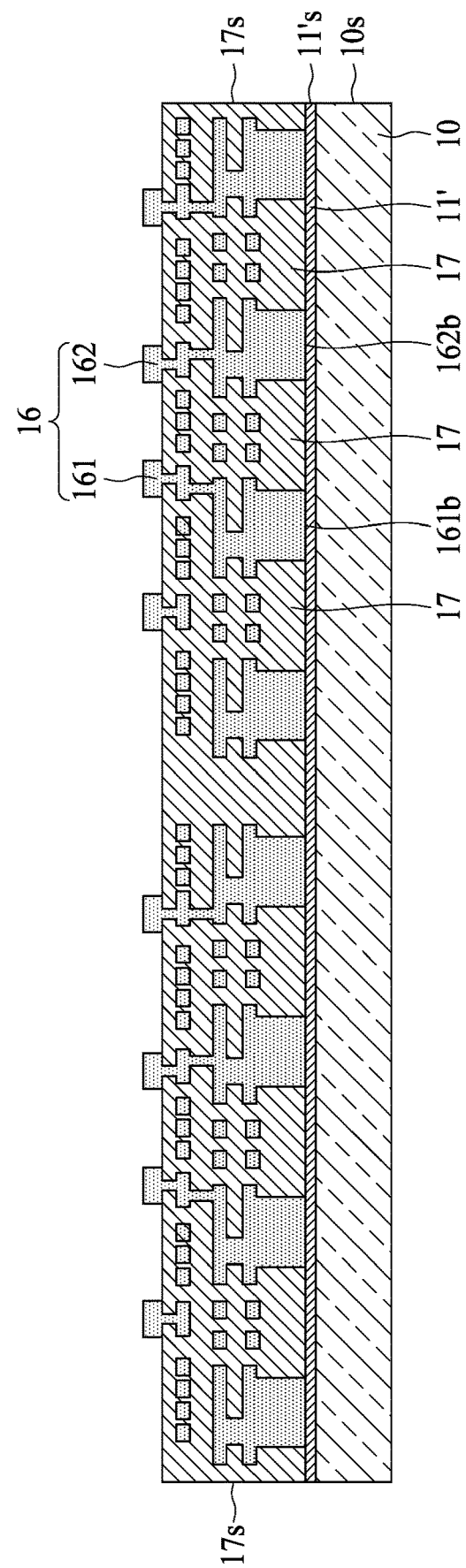

Referring to FIG. 1G, an insulation medium is disposed in the structure as shown in FIG. 1F. The conductive layer 11 is changed to the insulation medium 11' by changing characteristic of the conductive layer 11. The characteristic of the conductive layer 11 is changed to be non-conductive. The characteristic of the conductive layer 11 is changed by physical techniques.

The characteristic of the conductive layer 11 is changed by optical techniques. For example, the conductive material 11 is exposed to light of certain wavelengths (such as ultraviolet, infrared, laser, and etc.). After exposure to the light, the conductive material 11 is changed to be non-conductive.

The characteristic of the conductive layer 11 is changed by magnetic techniques. For example, the conductive material 11 is exposed to magnetic forces (such as magnetization force and de-magnetization force). After exposure to the magnetic force, the conductive material 11 is changed to be non-conductive.

The characteristic of the conductive layer 11 is changed by thermal techniques. For example, the conductive material 11 is exposed to temperature changes. After exposure to the temperature changes, the conductive material 11 is changed to be non-conductive. The conductive layer 11 may include vanadium dioxide. The vanadium dioxide is non-conductive when disposed at relatively lower temperatures (e.g. room temperature) and is conductive at relatively higher temperatures (e.g., when heated during semiconductor device manufacturing processes).

The characteristic of the conductive layer 11 is changed by electrical techniques. The conductive layer 11 can include materials where the current flow of the material can change. The conductive layer 11 can include materials that are conductive under high voltages or high currents. The materials are non-conductive under low voltages or low currents.

As shown in FIG. 1G, the characteristic of the entire conductive layer 11 is changed. The entire conductive layer 11 is changed to the insulation medium 11'. The insulation medium can include an insulation layer.

The patterned conductive layer 16 has portions 161 and 162. The portion 162 is electrically disconnected from the portion 161. The portion 161 has a surface 161b adjacent to the insulation layer 11'. The portion 161 is exposed by the patterned passivation layer 17. The portion 162 has a surface 162b adjacent to the insulation layer 11'. The surface 162b is exposed by the patterned passivation layer 17. The surface 161b of the portion 161 is in direct contact with the insulation layer 11'. The surface 162b of the portion 162 is in direct contact with the insulation layer 11'.

The insulation layer 11' is disposed between the carrier 10 and the portion 161 of the patterned conductive layer 16. The insulation layer 11' is disposed between the carrier 10 and the portion 162 of the patterned conductive layer 16. The insulation layer 11' is disposed between the carrier 10 and the patterned passivation layer 17. A side surface 11's of the insulation layer 11' is substantially coplanar with a side surface 17s of the patterned passivation layer 17. The side surface 11's of the insulation layer 11' is substantially coplanar with a side surface 10s of the carrier 10.

Figure 1H:
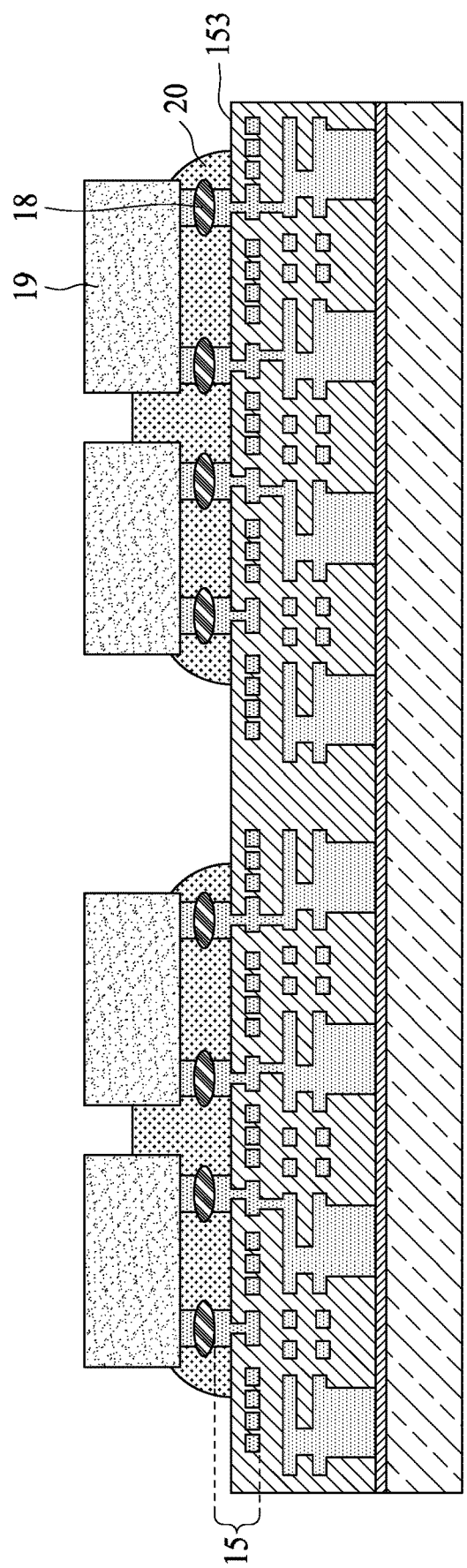

Referring to FIG. 1H, a bump material 18 is disposed on the structure as shown in FIG. 1G. A semiconductor device 19 is disposed on the patterned conductive layer 16. The semiconductor device 19 is electrically connected to the patterned conductive layer 16. The semiconductor device 19 is electrically connected to the bump material 18. An underfill 20 is formed on a surface 153 of the RDL 15. The underfill 20 secures the semiconductor device 19 to the RDL 15.

Figure 1I:
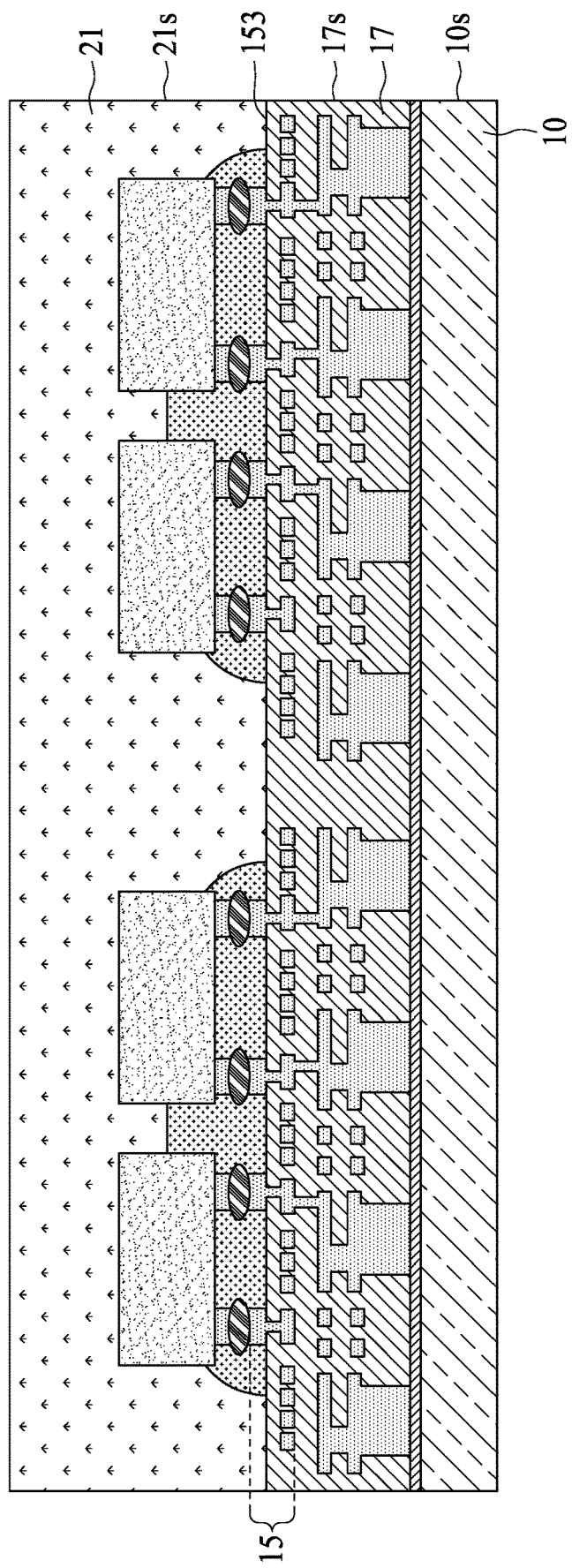

Referring to FIG. 1I, an encapsulation layer 21 is disposed on the structure as shown in FIG. 1H. The encapsulation layer 21 is disposed on the surface 153. The encapsulation layer 21 is disposed on the patterned conductive layer 16. The encapsulation layer 21 encapsulates the semiconductor device 19. The encapsulation layer 21 encapsulates the underfill 20. A side surface 21s of the encapsulant 21 is substantially coplanar with a side surface 17s of the patterned passivation layer 17. A side surface 21s of the encapsulant 21 is substantially coplanar with a side surface 10s of the carrier 10.

Figure 1J:
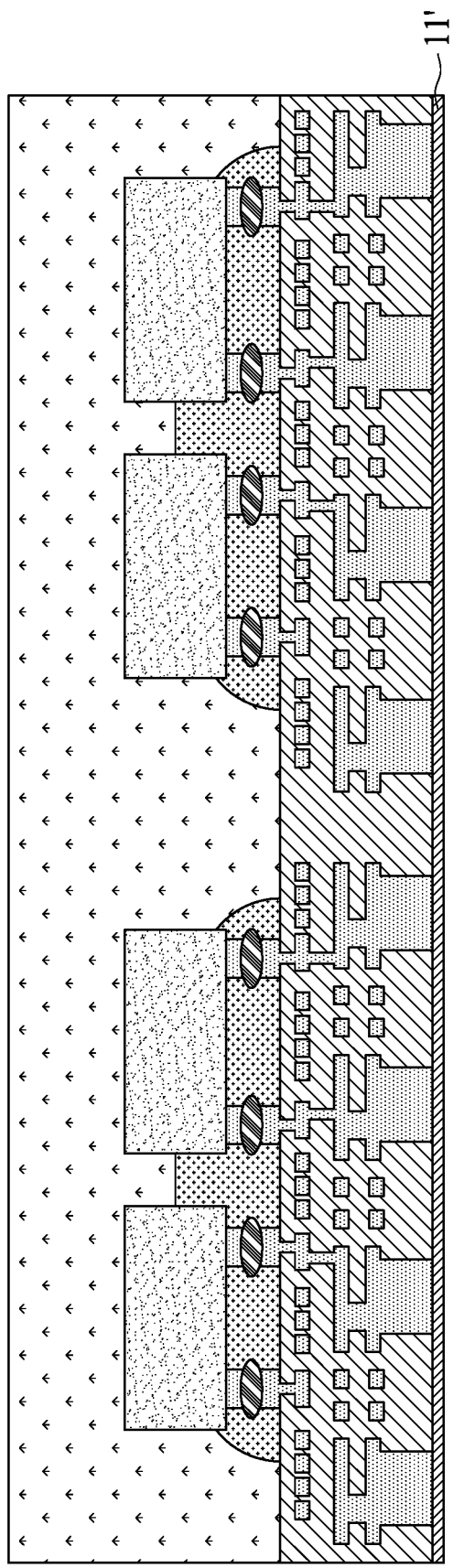
FIG. 1J, FIG. 1K, and FIG. 1L illustrate various stages of manufacturing a semiconductor device package according to some embodiments of the present disclosure.

Referring to FIG. 1J, the entire carrier 10 is removed from the structure as shown in FIG. 1I. The removing includes removing the carrier 10 using wet etching techniques.

Figure 1K:
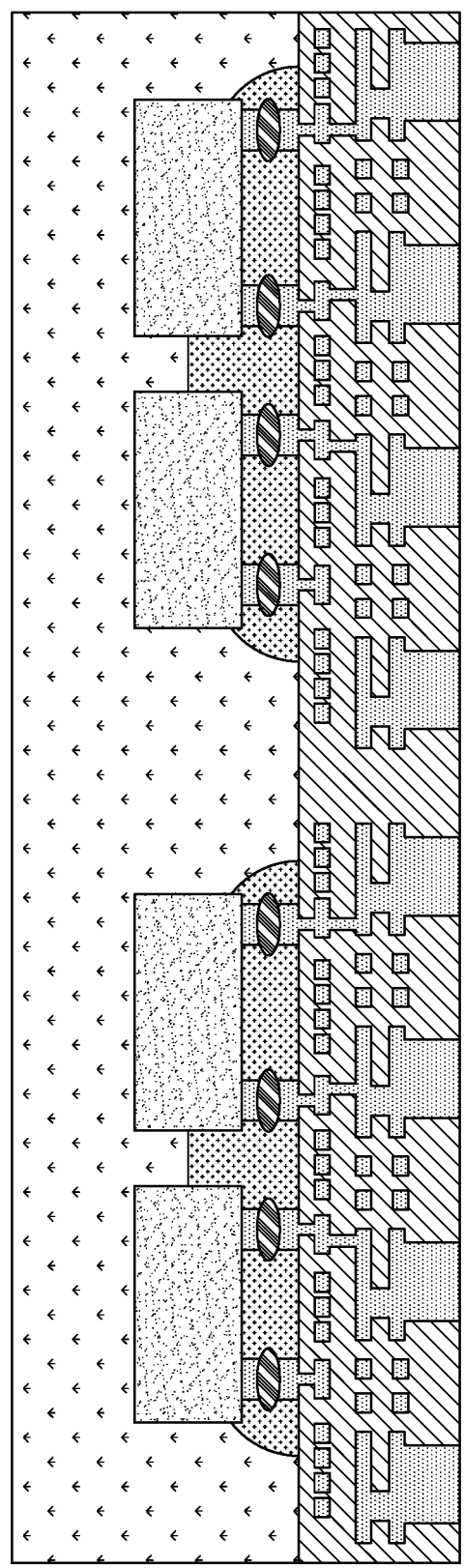

Referring to FIG. 1K, the entire insulation layer 11' is removed from the structure as shown in FIG. 1J. In other words, the insulation layer 11' can include air. The removing includes removing using wet etching techniques.

Figure 1L:
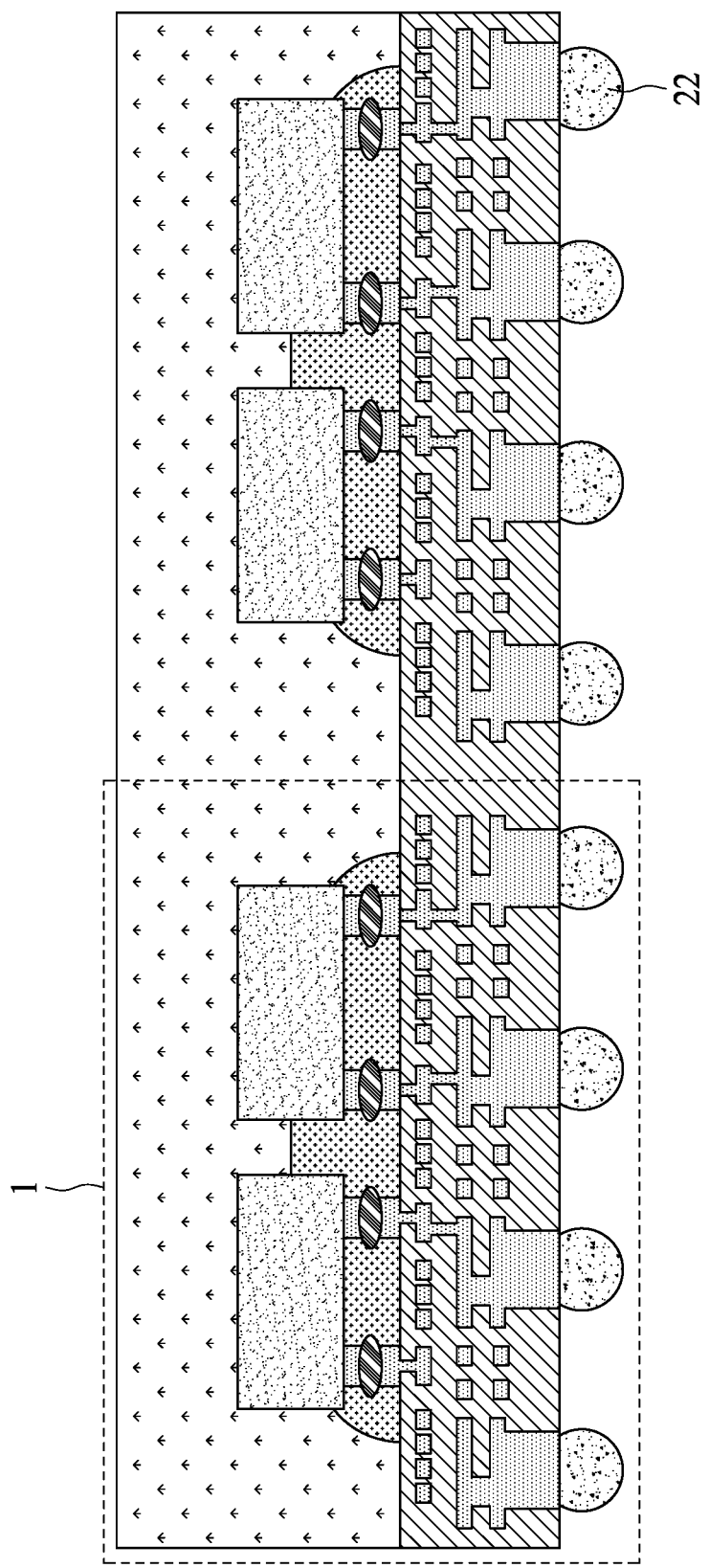

Referring to FIG. 1L, solder balls 22 are disposed below the structure as shown in FIG. 1K. The semiconductor device 1 is formed by singulating the structure as shown in FIG. 1L.

FIG. 1A, FIG. 1B, FIG. 1C, FIG. 1D, FIG. 1E, FIG. 1F, FIG. 2A, FIG. 2B, FIG. 2C FIG. 2D, FIG. 1K and FIG. 1L illustrate a method of manufacturing a semiconductor device package at various stages according to some embodiments of the present disclosure.

Figure 2A:
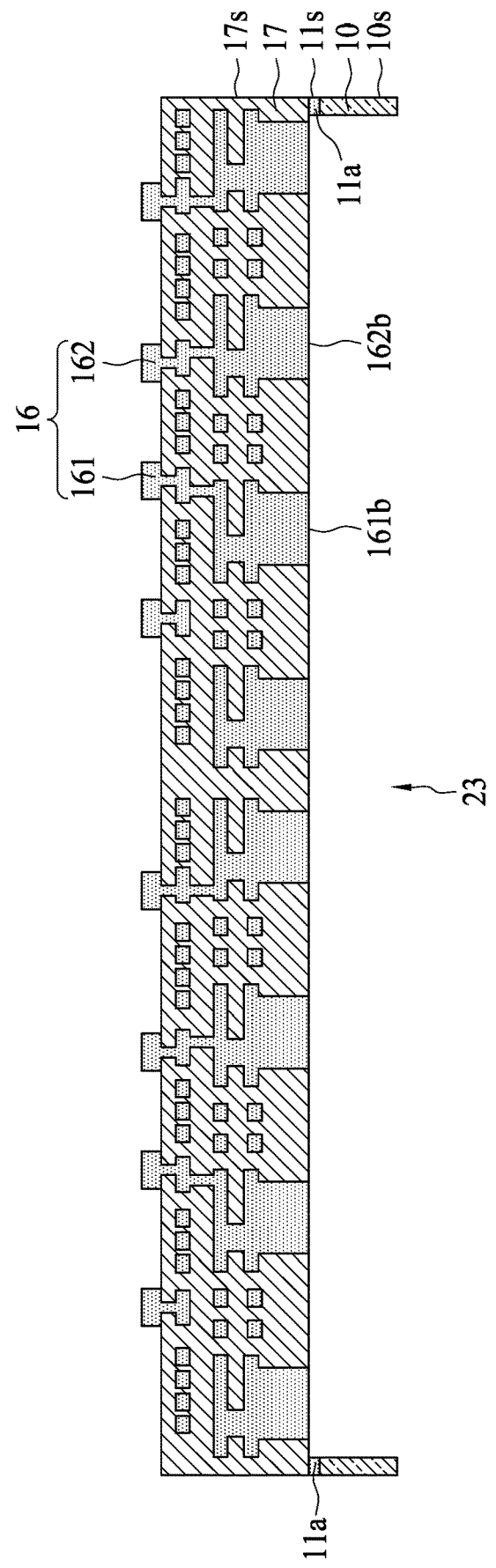
FIG. 2A, FIG. 2B, FIG. 2C, and FIG. 2D illustrate various stages of manufacturing a semiconductor device package according to some embodiments of the present disclosure.

FIG. 2A follows the operation of FIG. 1F. After manufacturing the structure in FIG. 1F, a part of the carrier 10 is removed. A part of the conductive layer 11 is removed to form a patterned conductive layer 11a. The carrier 10 defines an opening 23 to expose the surface 161b of the portion 161 to the air. The carrier 10 defines an opening 23 to expose the surface 162b of the portion 162 to the air. The patterned conductive layer 11a is disposed between the carrier 10 and the patterned passivation layer 17. The patterned conductive layer 11a defines an opening 23 to expose the surface 161b of the portion 161 to the air. The patterned conductive layer 11a defines an opening 23 to expose the 162b surface of the portion 162 to the air.

A side surface 11s of the patterned conductive layer 11a is substantially coplanar with the side surface 17s of the patterned passivation layer 17. The side surface 11s of the patterned conductive layer 11a is substantially coplanar with the side surface 10s of the carrier 10. The carrier 10 comprises a ring or ring-like pattern. The patterned conductive layer 11a comprises a ring or ring-like pattern. The semiconductor device package of FIG. 2A is strong enough to be handled and the subsequent packaging processes can continue. Electrical tests are performed on the structure as shown in FIG. 2A. Only the structures that pass the electrical tests are used to perform the following processes.

Figure 2B:
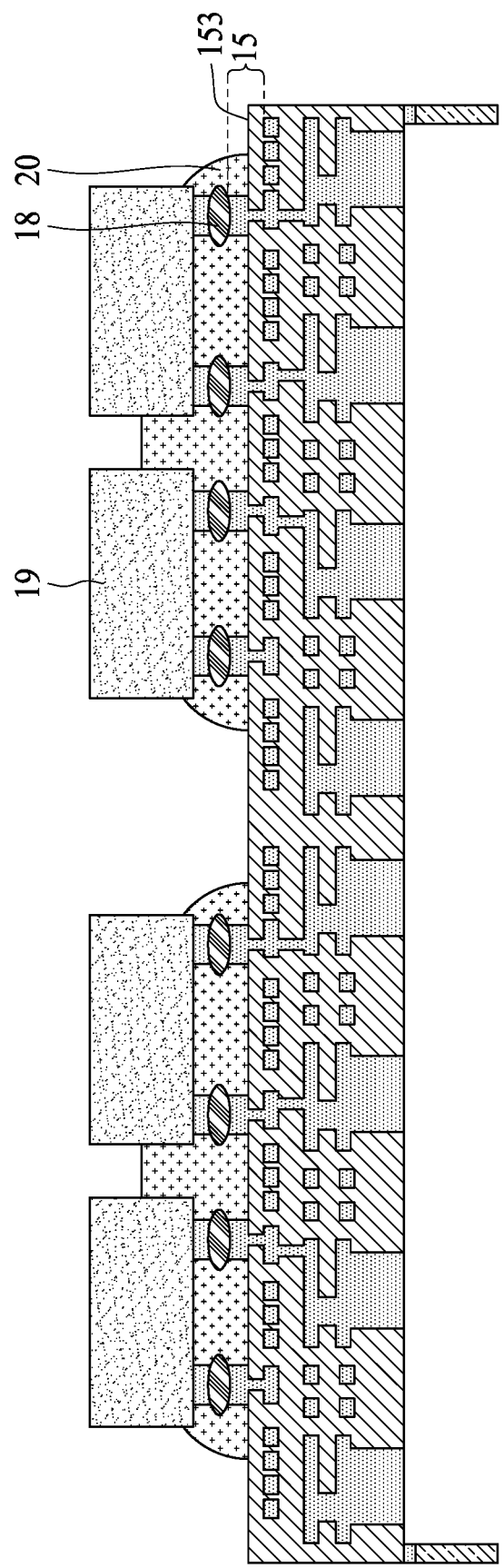

Referring to FIG. 2B, a bump material 18 is disposed on the structure as shown in FIG. 2A. A semiconductor device 19 is disposed on the patterned conductive layer 16. The semiconductor device 19 is electrically connected to the patterned conductive layer 16. The semiconductor device 19 is electrically connected to the bump material 18. An underfill 20 is formed on a surface 153 of the RDL 15. The underfill 20 secures the semiconductor device 19 to the RDL 15.

Figure 2C:
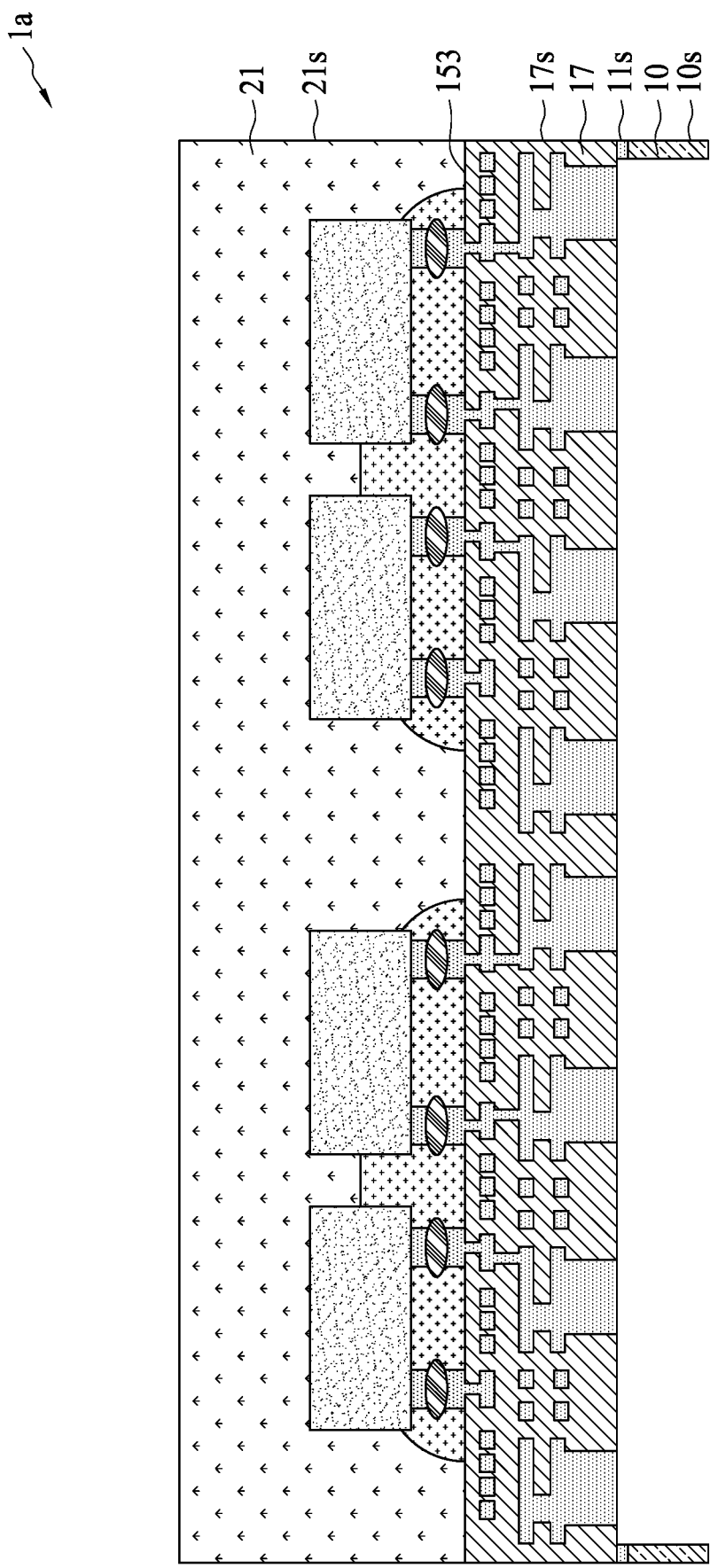

Referring to FIG. 2C, an encapsulation layer 21 is disposed on the structure as shown in FIG. 2B. The encapsulation layer 21 is disposed on the surface 153. The encapsulation layer 21 is disposed on the patterned conductive layer 16. The encapsulation layer 21 encapsulates the semiconductor device 19. The encapsulation layer 21 encapsulates the underfill 20. A side surface 21s of the encapsulant 21 is substantially coplanar with a side surface 17s of the patterned passivation layer 17. A side surface 21s of the encapsulant 21 is substantially coplanar with a side surface 10s of the carrier 10.

Figure 2D:
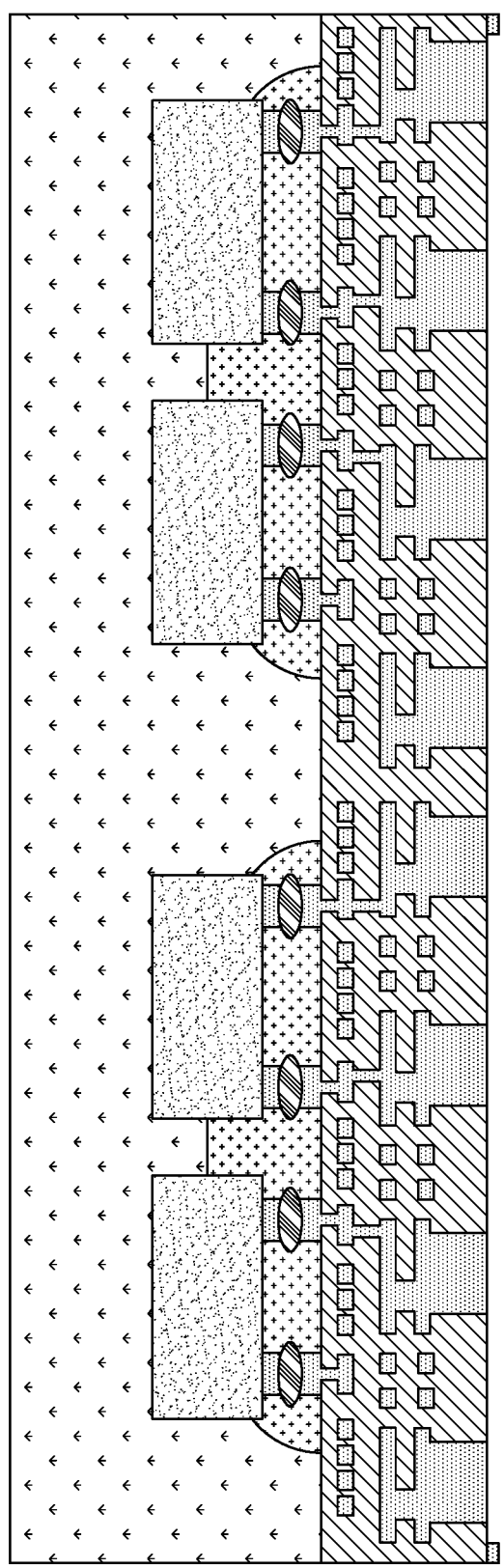

Referring to FIG. 2D, the carrier 10 is removed from the structure as shown in FIG. 2C. Afterwards, the patterned conductive layer 11a is removed. After the removing, the structure is the same as the structure as shown in FIG. 1K. The operation of FIG. 1L is performed. The semiconductor device 1 is formed by singulating the structure as shown in FIG. 1L.

Figure 2E:
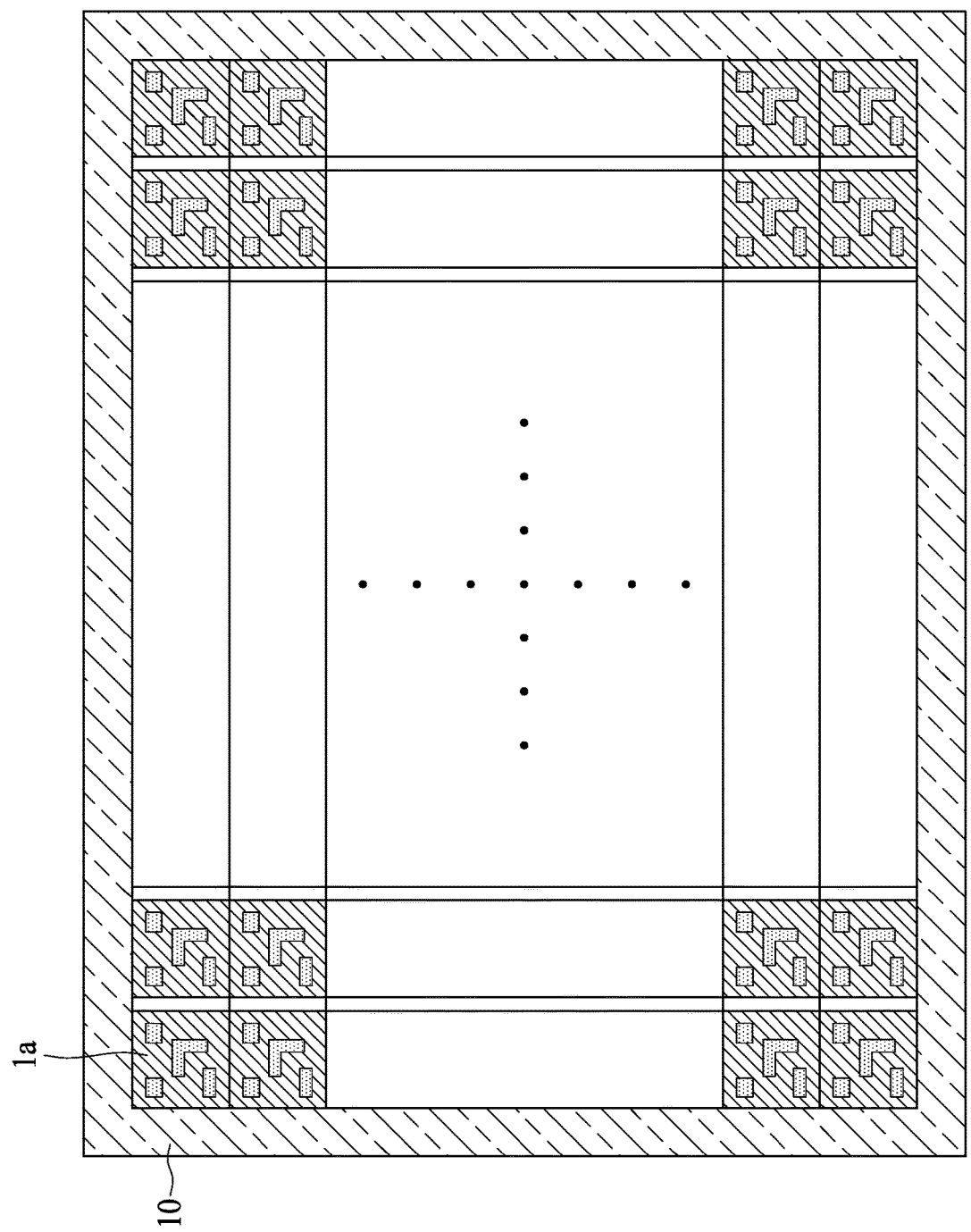
FIG. 2E illustrates a bottom view of a panel of the semiconductor device packages as shown in FIG. 2C.

FIG. 2E illustrates a cross-sectional view of a panel of the semiconductor device packages 1a as shown in FIG. 2C. The semiconductor device packages 1a are disposed in a rectangular or rectangle-like shape. However, it is contemplated that the semiconductor device packages 1a can be arranged in a shape other than the above. The semiconductor device packages 1a may be disposed in an array. The carrier 10 encloses the semiconductor device packages 1a. The carrier 10 surrounds the semiconductor device packages 1a. The semiconductor device packages 1a are separated from each other on the panel.

Figure 2F:
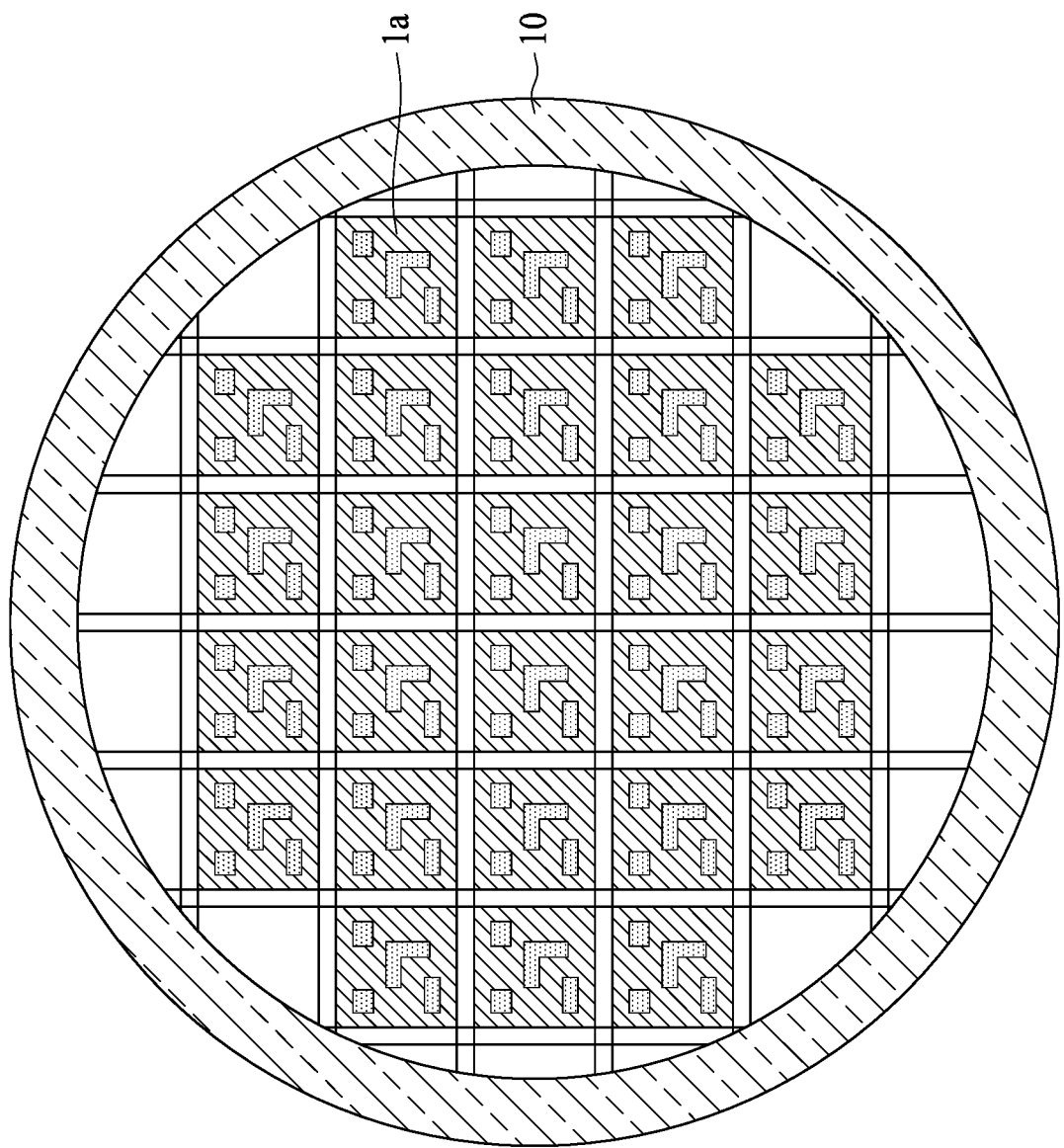
FIG. 2F illustrates a bottom view of a panel of the semiconductor device packages as shown in FIG. 2C.

FIG. 2F illustrates a cross-sectional view of a panel of the semiconductor device packages 1a as shown in FIG. 2C. The semiconductor device packages 1a are disposed in a circle or circle-like shape. The semiconductor device packages 1a may be disposed in an array. The carrier 10 encloses the semiconductor device packages 1a. The carrier 10 surrounds the semiconductor device packages 1a. The semiconductor device packages 1a are separated from each other on the panel.

FIG. 1A, FIG. 1B, FIG. 1C, FIG. 1D, FIG. 1E, FIG. 1F, FIG. 3A, FIG. 3B, FIG. 3C, FIG. 3D, FIG. 1K and FIG. 1L illustrate a method of manufacturing a semiconductor device package at various stages according to some embodiments of the present disclosure.

Figure 3A:
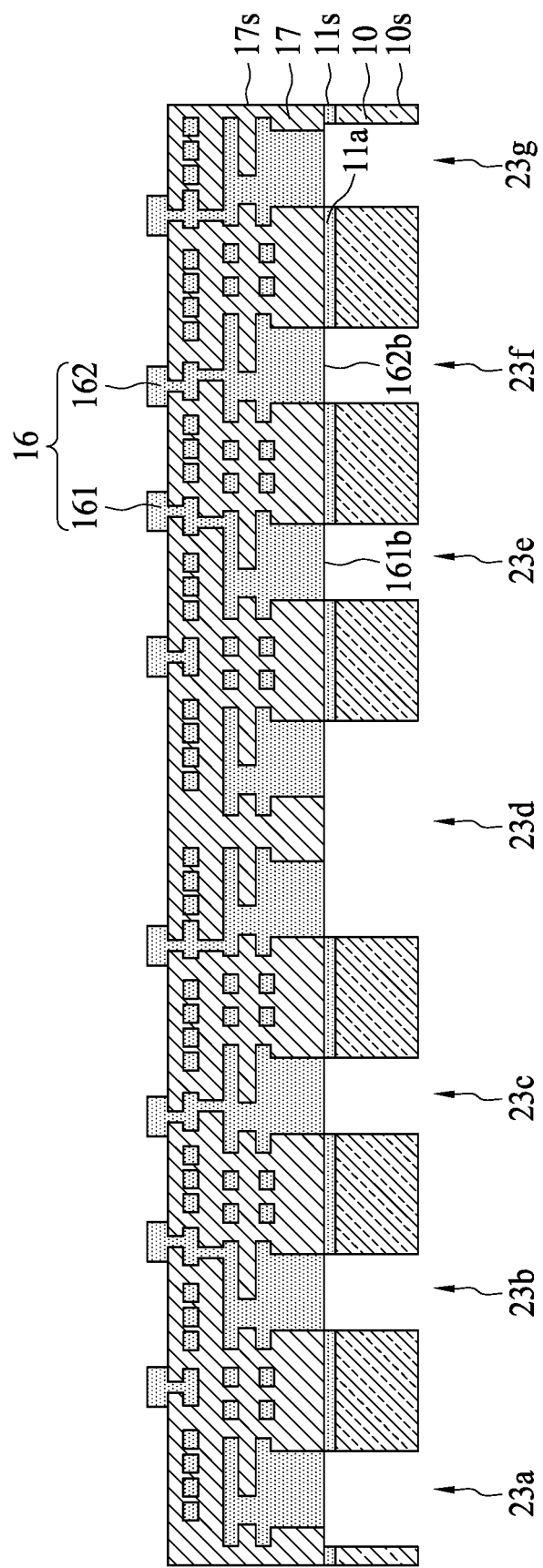
FIG. 3A, FIG. 3B, FIG. 3C, and FIG. 3D illustrate various stages of manufacturing a semiconductor device package according to some embodiments of the present disclosure.

FIG. 3A follows the operation of FIG. 1F. After manufacturing the structure in FIG. 1F, parts of the carrier 10 are removed. Parts of the conductive layer 11 are removed to form a patterned conductive layer 11a. The carrier 10 defines openings 23a, 23b, 23c, 23d, 23e, 23f and 23g. The carrier 10 defines the opening 23e to expose the surface 161b of the portion 161 to the air. The carrier 10 defines the opening 23f to expose the surface 162b of the portion 162 to the air. The patterned conductive layer 11a defines openings to expose the surface 161b of the portion 161 to the air. The patterned conductive layer 11a defines openings to expose the 162b surface of the portion 162 to the air.

A side surface 11s of the patterned conductive layer 11a is substantially coplanar with the side surface 17s of the patterned passivation layer 17. The side surface 11s of the patterned conductive layer 11a is substantially coplanar with the side surface 10s of the carrier 10. The carrier 10 may include a pattern of grid. The patterned conductive layer 11a may include a pattern of grid. The semiconductor device package of FIG. 3A is strong enough to be handled and the subsequent packaging processes can continue. Electrical tests are performed on the structure as shown in FIG. 3A. Only the structures that pass the electrical tests are used to perform the following processes.

Figure 3B:
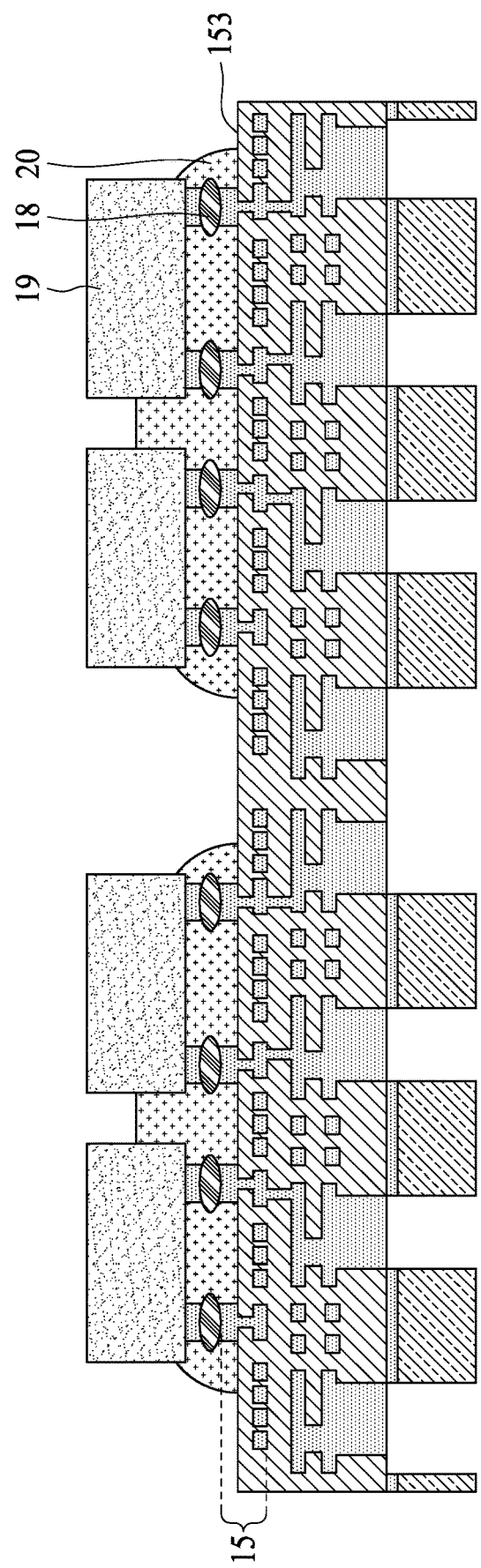

Referring to FIG. 3B, a bump material 18 is disposed on the structure as shown in FIG. 3A. A semiconductor device 19 is disposed on the patterned conductive layer 16. The semiconductor device 19 is electrically connected to the patterned conductive layer 16. The semiconductor device 19 is electrically connected to the bump material 18. An underfill 20 is formed on a surface 153 of the RDL 15. The underfill 20 secures the semiconductor device 19 to the RDL 15.

Figure 3C:
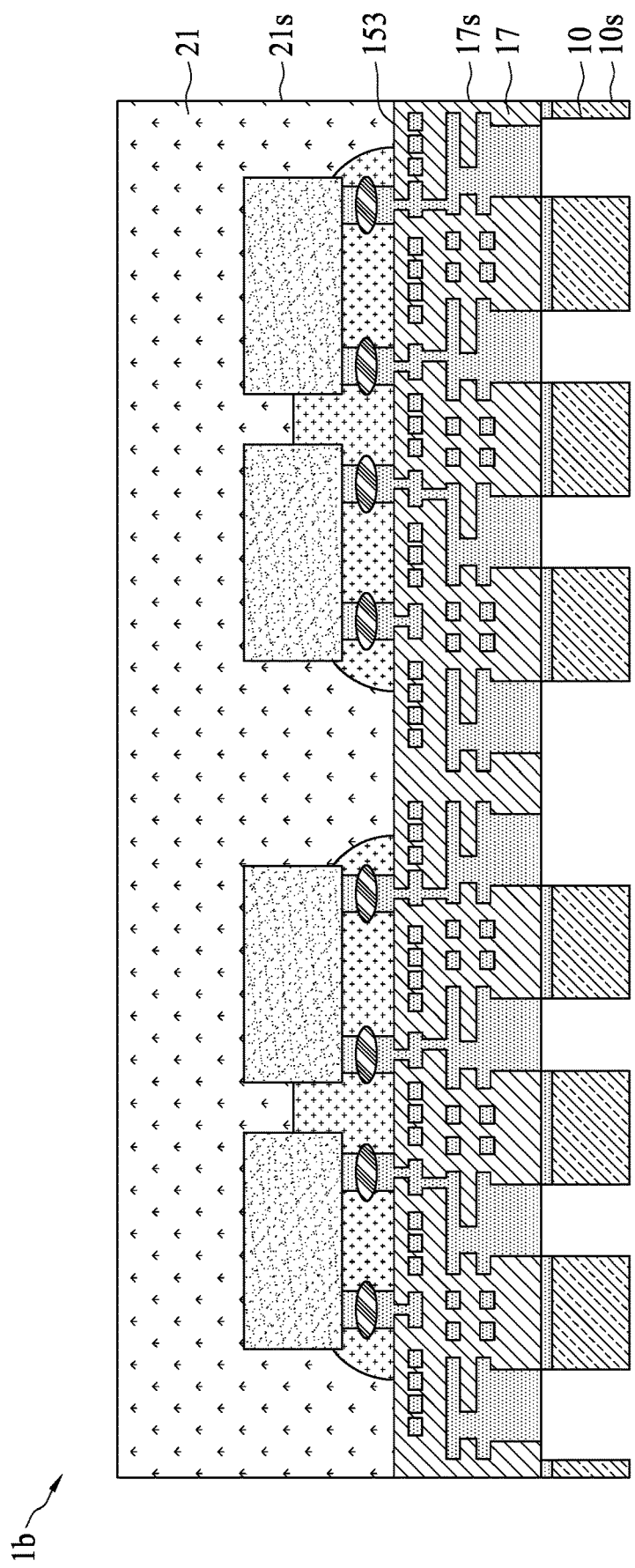

Referring to FIG. 3C, an encapsulation layer 21 is disposed on the structure as shown in FIG. 3B. The encapsulation layer 21 is disposed on the surface 153. The encapsulation layer 21 is disposed on the patterned conductive layer 16. The encapsulation layer 21 encapsulates the semiconductor device 19. The encapsulation layer 21 encapsulates the underfill 20. A side surface 21s of the encapsulant 21 is substantially coplanar with a side surface 17s of the patterned passivation layer 17. A side surface 21s of the encapsulant 21 is substantially coplanar with a side surface 10s of the carrier 10.

Figure 3D:
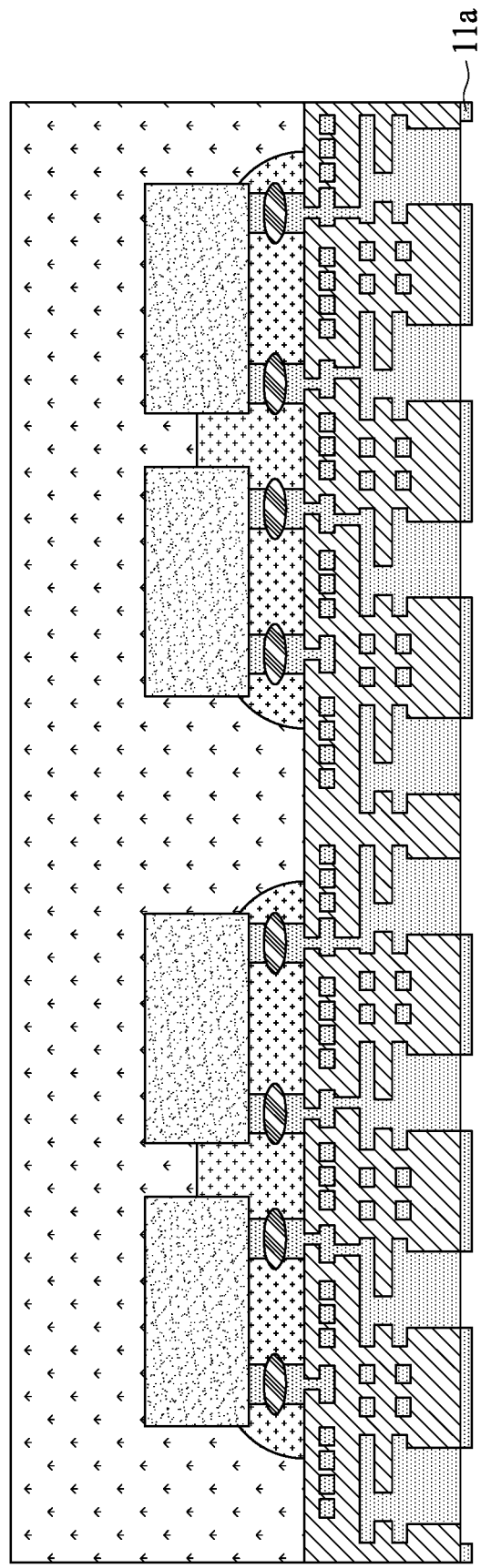

Referring to FIG. 3D, the carrier 10 is removed from the structure as shown in FIG. 3C. Afterwards, the patterned conductive layer 11a is removed. After the removing, the structure is the same as the structure as shown in FIG. 1K. The operation of FIG. 1L is performed. The semiconductor device 1 is formed by singulating the structure as shown in FIG. 1L.

Figure 3E:
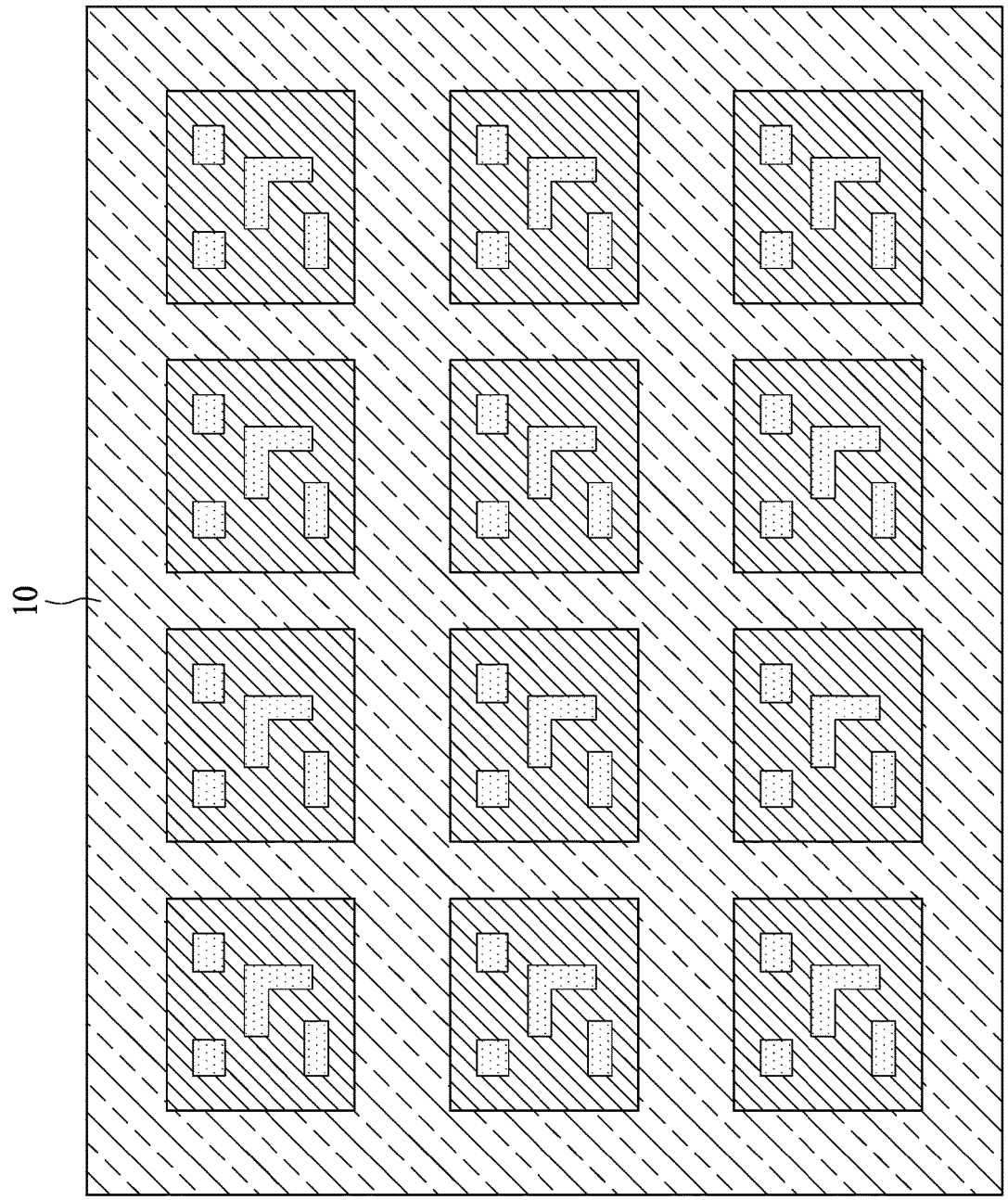
FIG. 3E illustrates a cross-sectional view of a panel of the semiconductor device packages as shown in FIG. 3C

FIG. 3E illustrates a cross-sectional view of a panel of the semiconductor device packages 1b as shown in FIG. 3C. The semiconductor device packages 1b are disposed in a rectangular or rectangle-like shape. However, it is contemplated that the semiconductor device packages 1b can be arranged in a shape other than the above. The semiconductor device packages 1b may be disposed in an array. The carrier 10 encloses the semiconductor device packages 1b. The carrier 10 surrounds the semiconductor device packages 1b. The semiconductor device packages 1b are separated from each other on the panel.

Figure 3F:
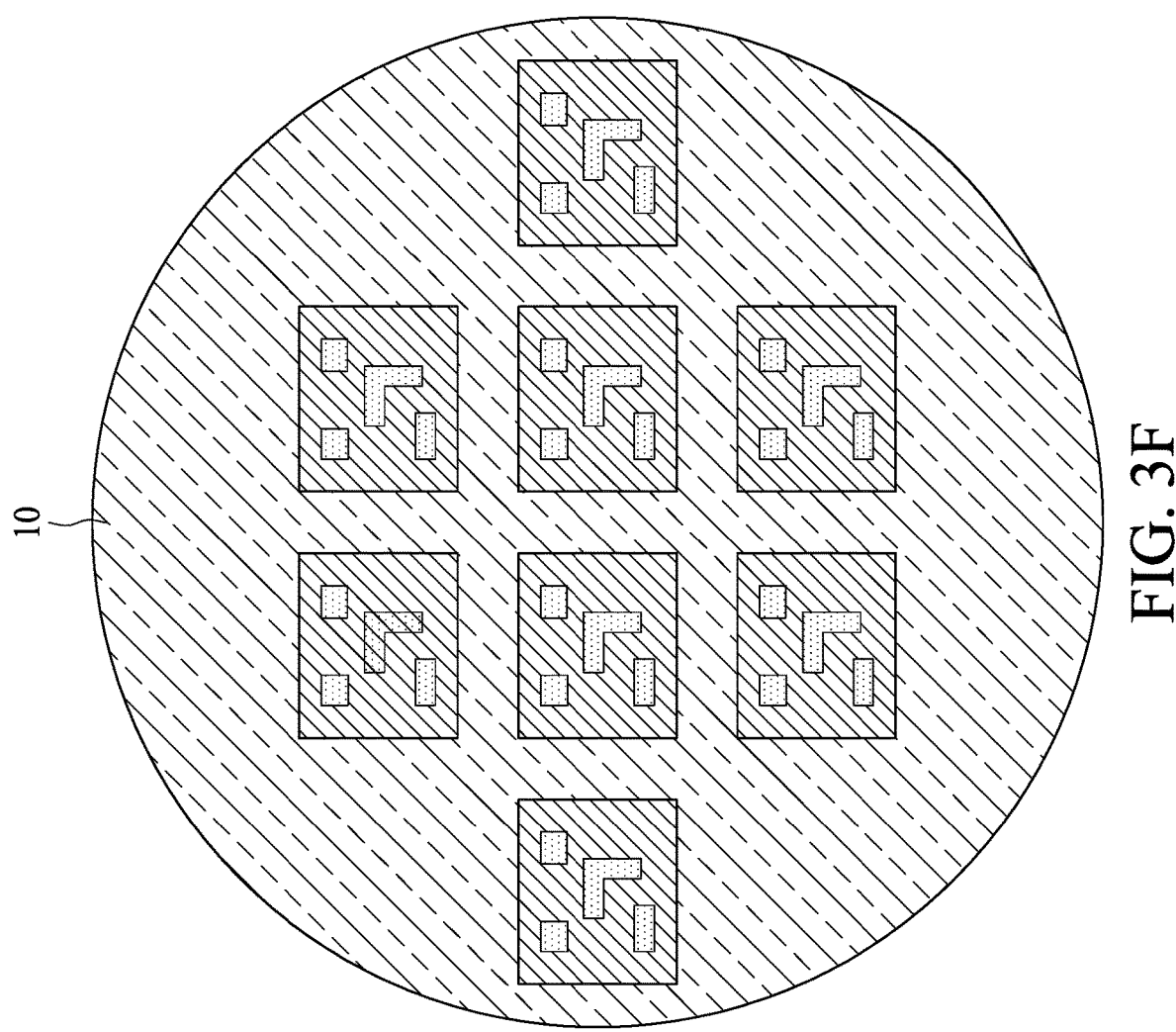
FIG. 3F illustrates a cross-sectional view of a panel of the semiconductor device packages as shown in FIG. 3C.

FIG. 3F illustrates a cross-sectional view of a panel of the semiconductor device packages 1b as shown in FIG. 3C. The semiconductor device packages 1b are disposed in a circle or circle-like shape. The semiconductor device packages 1b may be disposed in an array. The carrier 10 encloses the semiconductor device packages 1b. The carrier 10 surrounds the semiconductor device packages 1b. The semiconductor device packages 1b are separated from each other on the panel.

FIG. 1A, FIG. 1B, FIG. 1C, FIG. 1D, FIG. 1E, FIG. 1F, FIG. 4A, FIG. 4B, FIG. 4C, FIG. 4D, FIG. 4E, FIG. 4F, FIG. 1K and FIG. 1L illustrate a method of manufacturing a semiconductor device package at various stages according to some embodiments of the present disclosure.

Figure 4A:
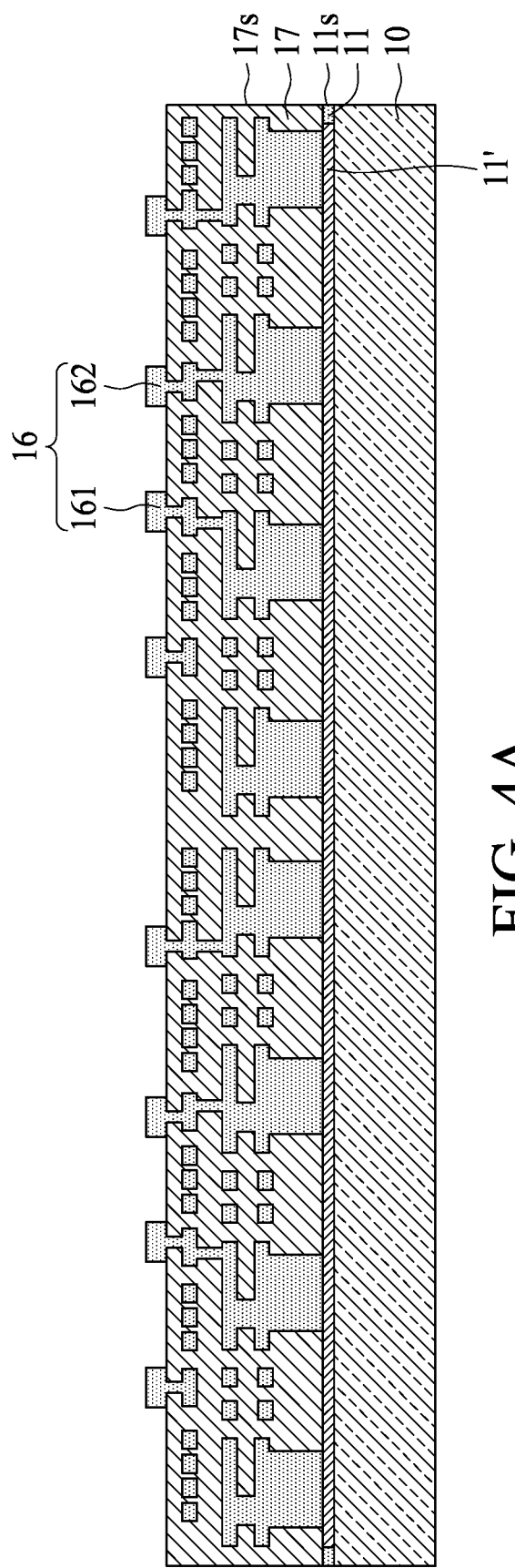
FIG. 4A, FIG. 4B, FIG. 4C, FIG. 4D, FIG. 4E, and FIG. 4F illustrate various stages of manufacturing a semiconductor device package according to some embodiments of the present disclosure.

FIG. 4A follows the operation of FIG. 1F. After manufacturing the structure in FIG. 1F, a portion of the conductive layer 11 is changed to the insulation medium 11' by changing characteristic of the conductive layer 11. The characteristic of a portion of the conductive layer 11 is not changed. The portion 11' of the conductive layer 11 is in direct contact with the portion 161 of the patterned conductive layer 16. The portion 11' of the conductive layer 11 is in direct contact with the portion 162 of the patterned conductive layer 16. The portion 11' of the conductive layer 11 is in direct contact with the patterned passivation layer 17.

The patterned conductive layer 11 is disposed between the carrier 10 and the patterned passivation layer 17. The patterned conductive layer 11 surrounds the insulation layer 11'. A side surface 11s of the patterned conductive layer 11 is substantially coplanar with a side surface 17s of the patterned passivation layer 17. The side surface 11s of the patterned conductive layer 11 is substantially coplanar with a side surface 10s of the carrier 10. The semiconductor device package of FIG. 4A is strong enough to be handled and the subsequent packaging processes can continue. Electrical tests are performed on the structure as shown in FIG. 4A. Only the structures that pass the electrical tests are used to perform the following processes.

Figure 4B:
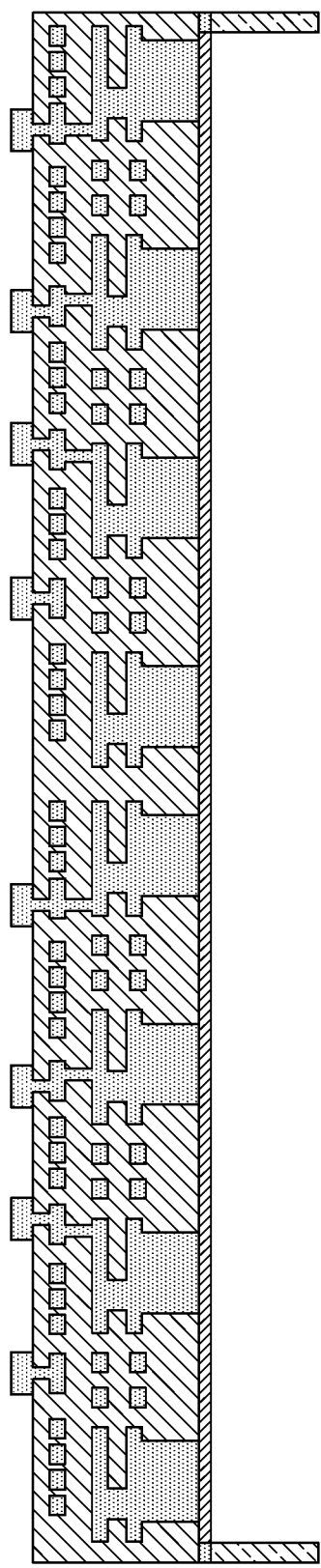

Referring to FIG. 4B, after manufacturing the structure in FIG. 4A, parts of the carrier 10 are removed.

Figure 4C:
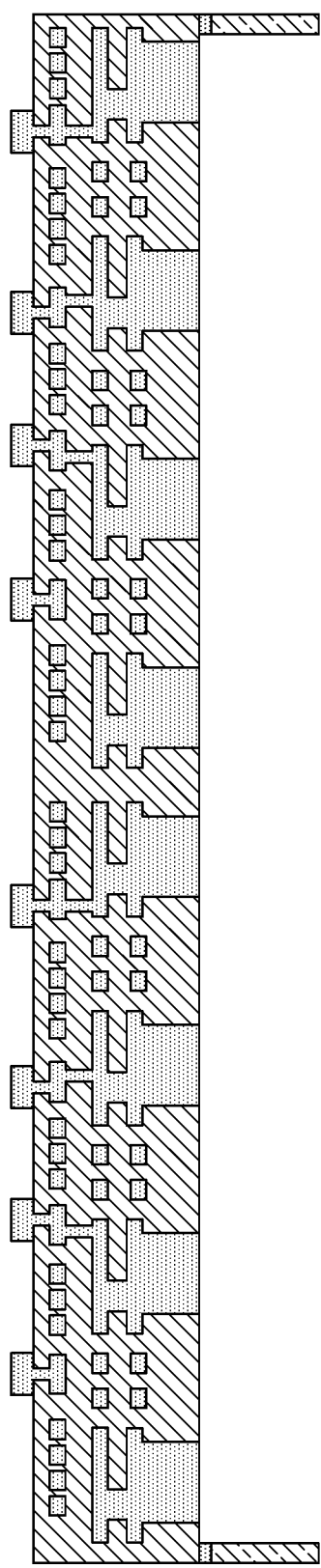

Referring to FIG. 4C, after manufacturing the structure in FIG. 4B, the insulation layer 11' is removed.

Figure 4D:
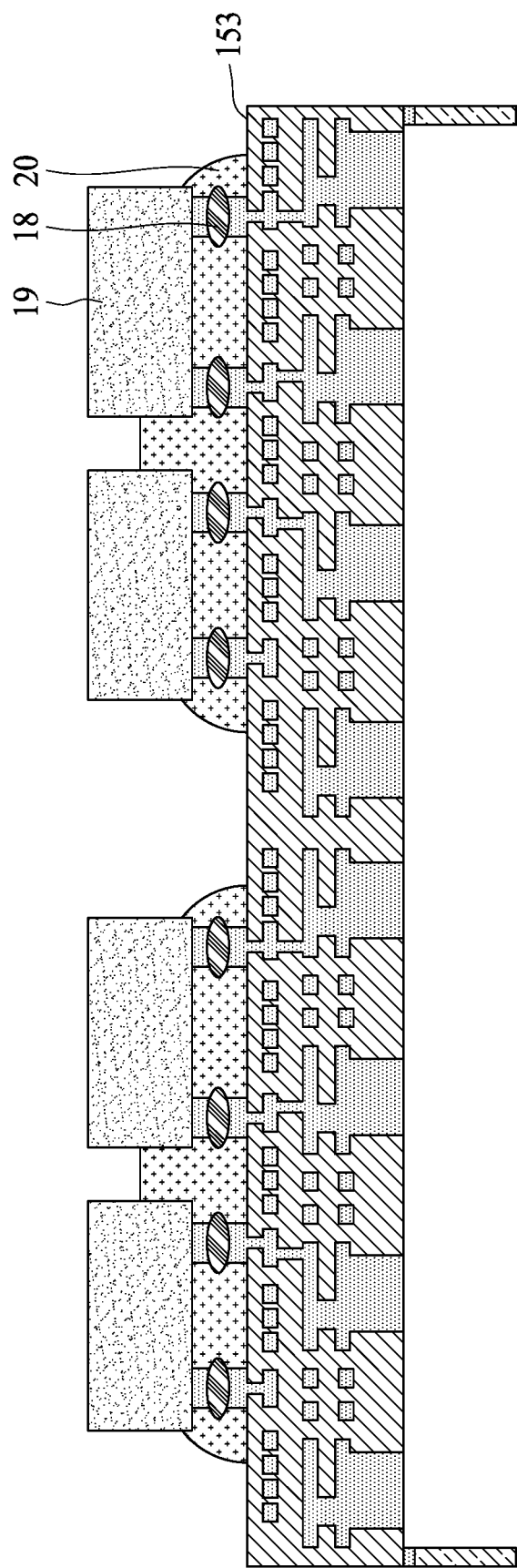

Referring to FIG. 4D, a bump material 18 is disposed on the structure as shown in FIG. 4C. A semiconductor device 19 is disposed on the patterned conductive layer 16. The semiconductor device 19 is electrically connected to the patterned conductive layer 16. The semiconductor device 19 is electrically connected to the bump material 18. An underfill 20 is formed on a surface 153 of the RDL 15. The underfill 20 secures the semiconductor device 19 to the RDL 15.

Figure 4E:
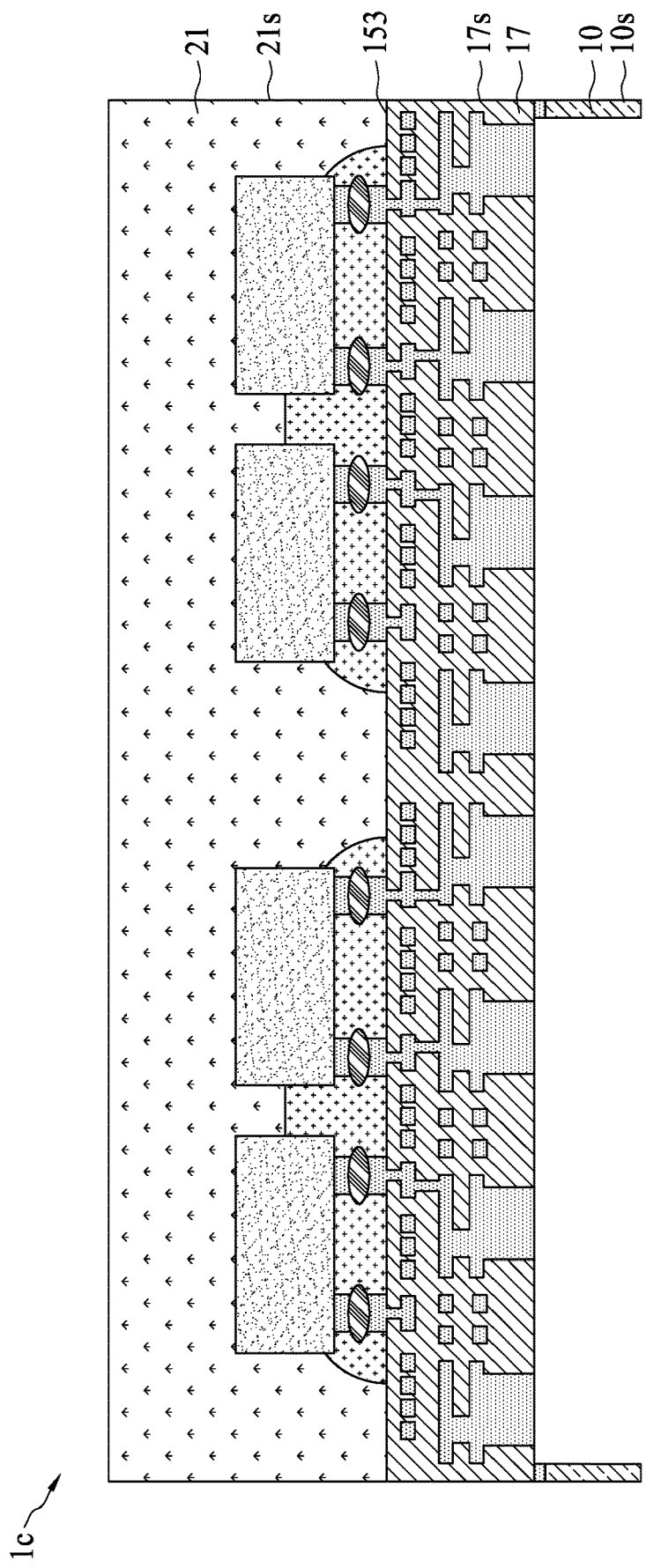

Referring to FIG. 4E, an encapsulation layer 21 is disposed on the structure as shown in FIG. 4D. The encapsulation layer 21 is disposed on the surface 153. The encapsulation layer 21 is disposed on the patterned conductive layer 16. The encapsulation layer 21 encapsulates the semiconductor device 19. The encapsulation layer 21 encapsulates the underfill 20. A side surface 21s of the encapsulant 21 is substantially coplanar with a side surface 17s of the patterned passivation layer 17. A side surface 21s of the encapsulant 21 is substantially coplanar with a side surface 10s of the carrier 10.

Figure 4F:
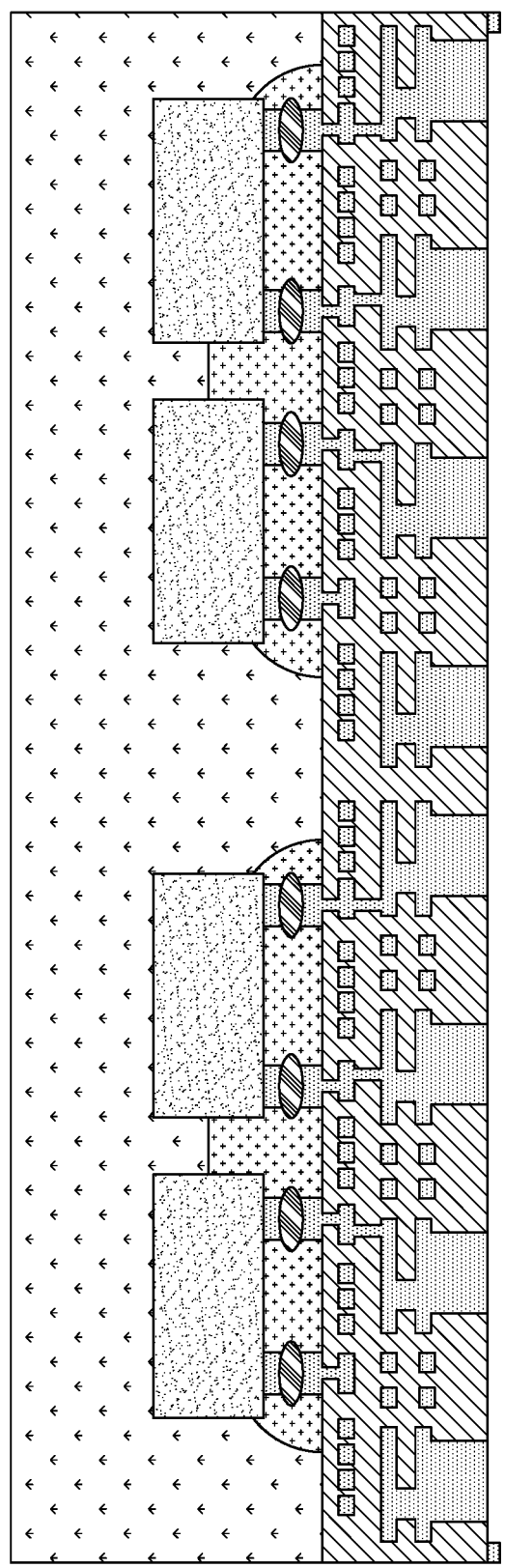

Referring to FIG. 4F, the carrier 10 is removed from the structure as shown in FIG. 4E. Afterwards, the patterned conductive layer 11 is removed. After the removing, the structure is the same as the structure as shown in FIG. 1K. The operation of FIG. 1L is performed. The semiconductor device 1 is formed by singulating the structure as shown in FIG. 1L.

FIG. 1A, FIG. 1B, FIG. 1C, FIG. 1D, FIG. 1E, FIG. 1F, FIG. 5A, FIG. 5B, FIG. 5C, FIG. 5D, FIG. 5E, FIG. 5F, FIG. 1K and FIG. 1L illustrate a method of manufacturing a semiconductor device package at various stages according to some embodiments of the present disclosure.

Figure 5A:
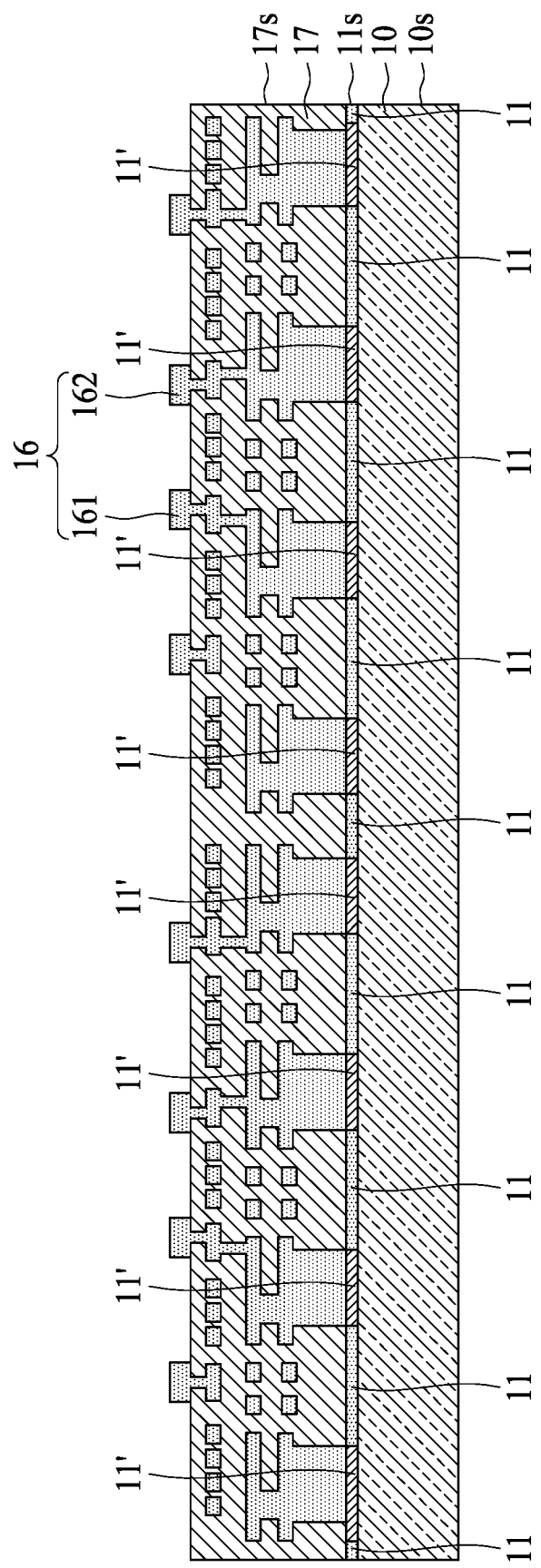
FIG. 5A, FIG. 5B, FIG. 5C, FIG. 5D, FIG. 5E, and FIG. 5F illustrate various stages of manufacturing a semiconductor device package according to some embodiments of the present disclosure.

FIG. 5A follows the operation of FIG. 1F. After manufacturing the structure in FIG. 1F, portions of the conductive layer 11 is changed to the insulation medium 11' by changing characteristic of the conductive layer 11. The characteristic of other portions of the conductive layer 11 is not changed. The portions 11' of the conductive layer 11 are in direct contact with the portion 161 of the patterned conductive layer 16. The portions 11' of the conductive layer 11 are in direct contact with the portion 162 of the patterned conductive layer 16. The portion of the conductive layer 11 is in direct contact with the patterned passivation layer 17.

The patterned conductive layer 11 is disposed between the carrier 10 and the patterned passivation layer 17. The patterned conductive layer 11 surrounds the insulation layer 11'. The patterned conductive layer 11 comprises a pattern of an array. A side surface 11s of the patterned conductive layer 11 is substantially coplanar with a side surface 17s of the patterned passivation layer 17. The side surface 11s of the patterned conductive layer 11 is substantially coplanar with a side surface 10s of the carrier 10. The semiconductor device package of FIG. 5A is strong enough to be handled and the subsequent packaging processes can continue. Electrical tests are performed on the structure as shown in FIG. 5A. Only the structures that pass the electrical tests are used to perform the following processes.

Figure 5B:
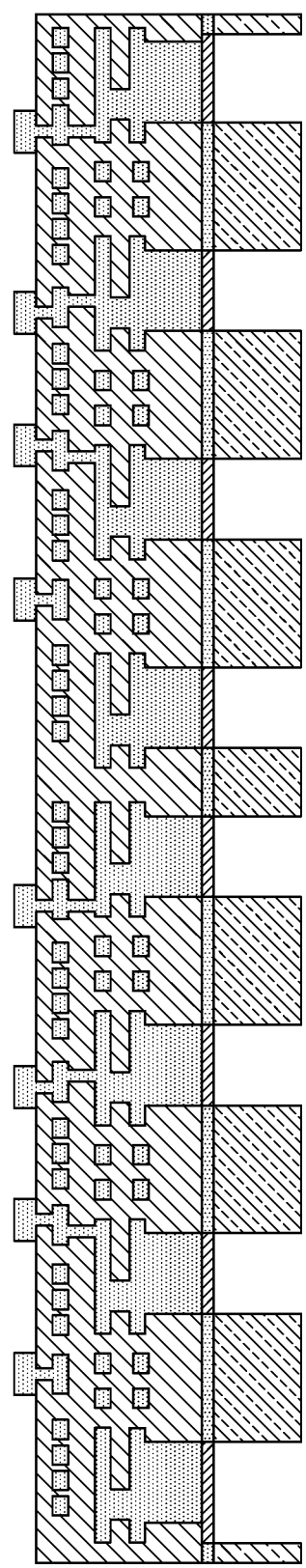

Referring to FIG. 5B, after manufacturing the structure in FIG. 5A, parts of the carrier 10 are removed. The carrier 10 may include a pattern of grid. The patterned conductive layer 11' may include a pattern of grid.

Figure 5C:
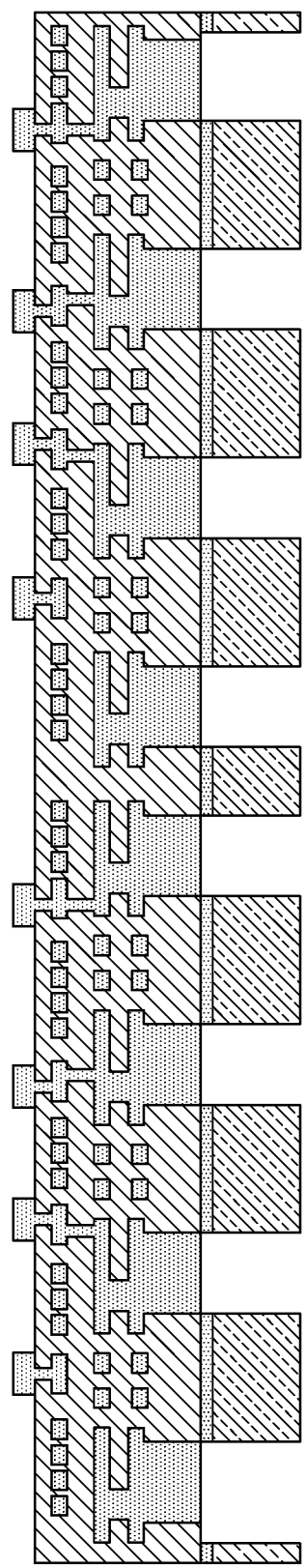

Referring to FIG. 5C, after manufacturing the structure in FIG. 5A, the insulation layer 11' is removed.

Figure 5D:
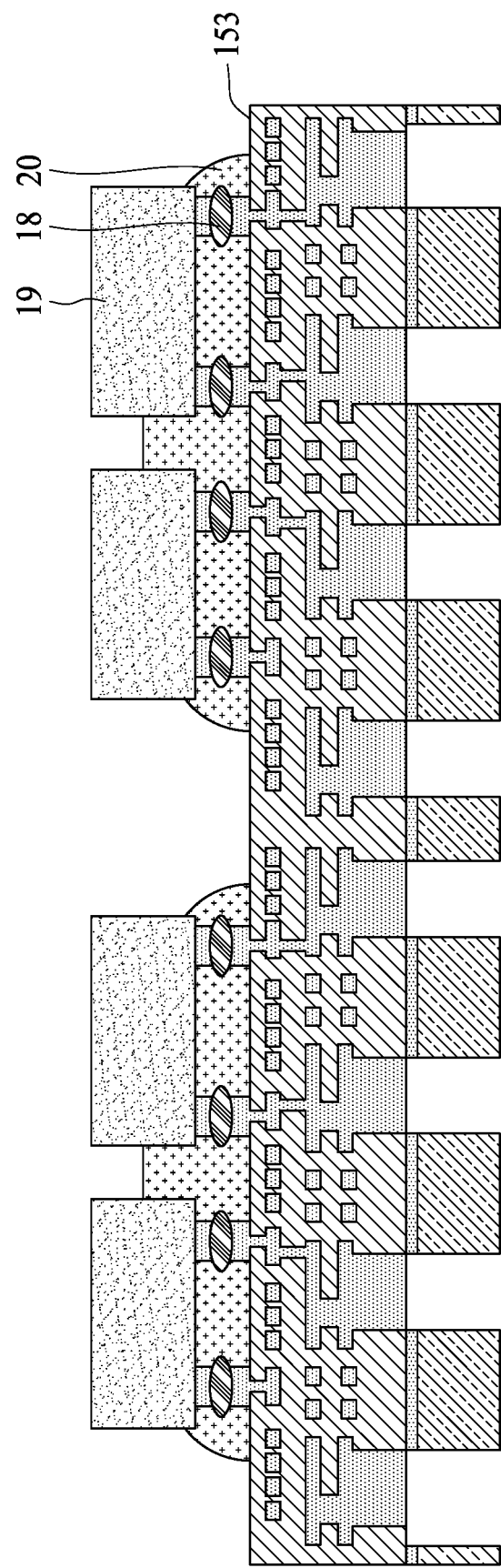

Referring to FIG. 5D, a bump material 18 is disposed on the structure as shown in FIG. 5C. A semiconductor device 19 is disposed on the patterned conductive layer 16. The semiconductor device 19 is electrically connected to the patterned conductive layer 16. The semiconductor device 19 is electrically connected to the bump material 18. An underfill 20 is formed on a surface 153 of the RDL 15. The underfill 20 secures the semiconductor device 19 to the RDL 15.

Figure 5E:
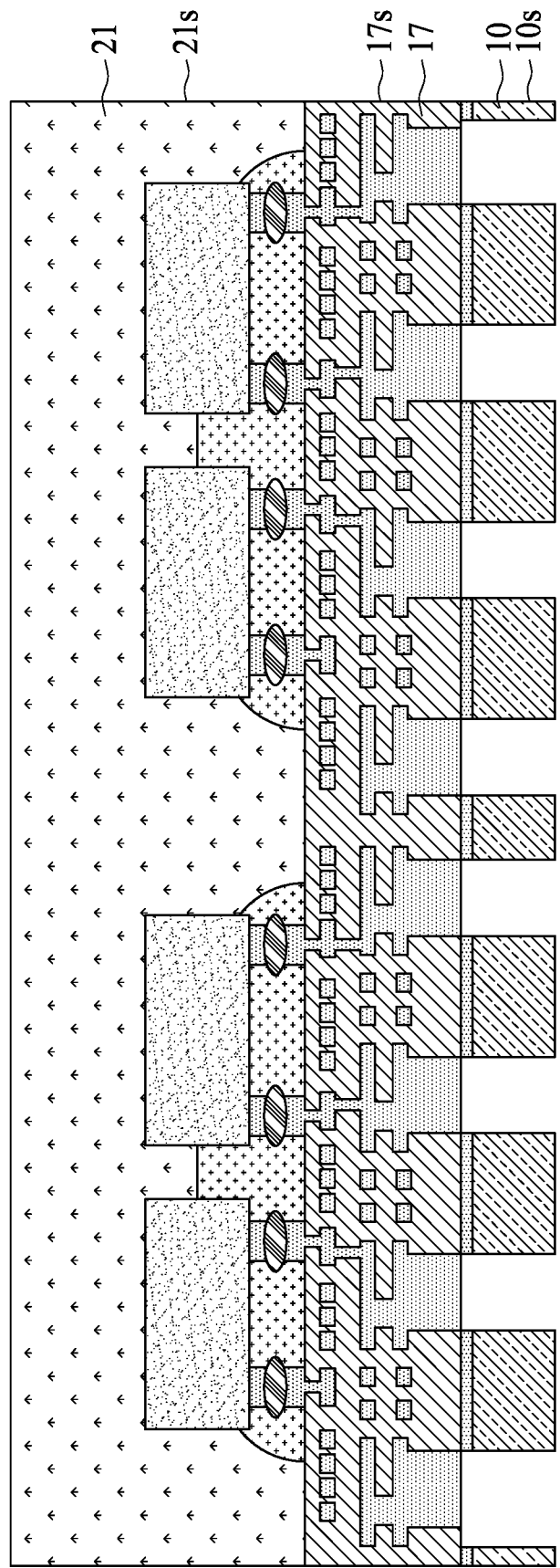

Referring to FIG. 5E, an encapsulation layer 21 is disposed on the structure as shown in FIG. 5D. The encapsulation layer 21 is disposed on the surface 153. The encapsulation layer 21 is disposed on the patterned conductive layer 16. The encapsulation layer 21 encapsulates the semiconductor device 19. The encapsulation layer 21 encapsulates the underfill 20. A side surface 21s of the encapsulant 21 is substantially coplanar with a side surface 17s of the patterned passivation layer 17. A side surface 21s of the encapsulant 21 is substantially coplanar with a side surface 10s of the carrier 10.

Figure 5F:
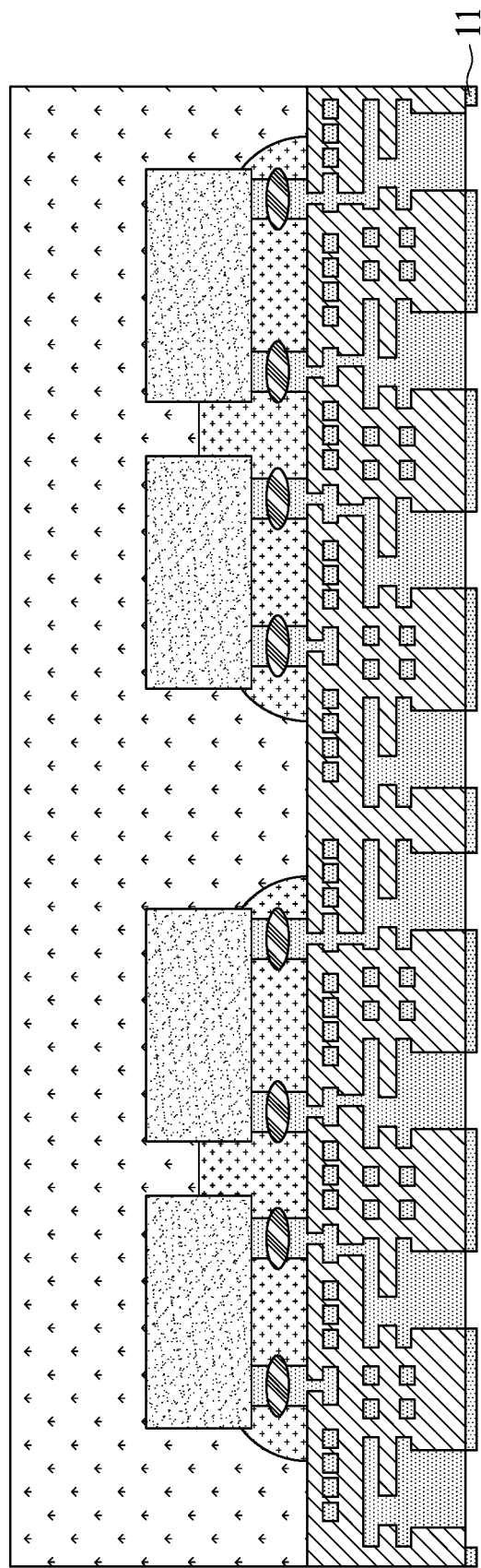

Referring to FIG. 5F, the carrier 10 is removed from the structure as shown in FIG. 5E. Afterwards, the patterned conductive layer 11 is removed. After the removing, the structure is the same as the structure as shown in FIG. 1K. The operation of FIG. 1L is performed. The semiconductor device 1 is formed by singulating the structure as shown in FIG. 1L.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05° For example, a first numerical value can be deemed to be "substantially" the same or equal to a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm. A surface can be deemed to be substantially flat if a displacement between a highest point and a lowest point of the surface is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

Ranges can be expressed herein as from one endpoint to another endpoint or between two endpoints. All ranges disclosed herein are inclusive of the endpoints, unless specified otherwise.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a carrier;
   a patterned passivation layer disposed on the carrier; and
   a first patterned conductive layer disposed on the carrier and surrounded by the patterned passivation layer, the first patterned conductive layer having a first portion and a second portion electrically disconnected from the first portion, the first portion having a first surface adjacent to the carrier and exposed by the patterned passivation layer, and the second portion having a first surface adjacent to the carrier exposed by the patterned passivation layer;
   wherein the first surface of the first portion is in direct contact with an insulation medium, wherein the insulation medium comprises an insulation layer, and wherein the insulation layer comprises a pattern of grid.

2. The semiconductor device package of claim 1, wherein the first surface of the second portion is in direct contact with the insulation medium.

3. The semiconductor device package of claim 1, wherein the insulation layer is disposed between the carrier and the first portion of the first patterned conductive layer.

4. The semiconductor device package of claim 1, wherein the insulation layer is disposed between the carrier and the second portion of the first patterned conductive layer.

5. The semiconductor device package of claim 1, wherein the insulation layer is disposed between the carrier and the patterned passivation layer.

6. The semiconductor device package of claim 1, wherein a side surface of the insulation layer is substantially coplanar with a side surface of the patterned passivation layer.

7. The semiconductor device package of claim 1, wherein a side surface of the insulation layer is substantially coplanar with a side surface of the carrier.

8. The semiconductor device package of claim 1, further comprising a second patterned conductive layer disposed between the carrier and the patterned passivation layer.

9. The semiconductor device package of claim 8, wherein the second patterned conductive layer surrounds the insulation layer.

10. The semiconductor device package of claim 8, wherein the second patterned conductive layer comprises a pattern of an array.

11. The semiconductor device package of claim 8, wherein a side surface of the second patterned conductive layer is substantially coplanar with a side surface of the patterned passivation layer.

12. The semiconductor device package of claim 8, wherein a side surface of the second patterned conductive layer is substantially coplanar with a side surface of the carrier.

13. The semiconductor device package of claim 1, further comprising a semiconductor device disposed on the first patterned conductive layer and electrically connected to the first patterned conductive layer.

14. The semiconductor device package of claim 13, further comprising an encapsulation layer disposed on the first patterned conductive layer and encapsulating the semiconductor device.

15. A semiconductor device package, comprising:
   a carrier;
   a patterned passivation layer disposed on the carrier; and
   a first patterned conductive layer disposed on the carrier and surrounded by the patterned passivation layer, the first patterned conductive layer having a first portion and a second portion electrically disconnected from the first portion, the first portion having a first surface adjacent to the carrier and exposed by the patterned passivation layer, and the second portion having a first surface adjacent to the carrier exposed by the patterned passivation layer;
   wherein the first surface of the first portion is in direct contact with an insulation medium, and wherein the insulation medium comprises air.

16. The semiconductor device package of claim 15, further comprising a second patterned conductive layer disposed between the carrier and the patterned passivation layer.

17. The semiconductor device package of claim 16, wherein a side surface of the second patterned conductive layer is substantially coplanar with a side surface of the patterned passivation layer.

18. The semiconductor device package of claim 16, wherein a side surface of the second patterned conductive layer is substantially coplanar with a side surface of the carrier.

19. The semiconductor device package of claim 16, wherein the second patterned conductive layer defines an opening to expose the first surface of the first portion to the air.

20. The semiconductor device package of claim 16, wherein the second patterned conductive layer defines an opening to expose the first surface of the second portion to the air.

21. The semiconductor device package of claim 16, wherein the second patterned conductive layer comprises a ring or ring-like pattern.

22. The semiconductor device package of claim 16, wherein the second patterned conductive layer comprises a pattern of grid.

23. The semiconductor device package of claim 15, wherein the carrier defines an opening to expose the first surface of the first portion to the air.

24. The semiconductor device package of claim 15, wherein the carrier defines an opening to expose the first surface of the second portion to the air.

25. The semiconductor device package of claim 15, wherein the carrier comprises a ring or ring-like pattern.

26. The semiconductor device package of claim 15, wherein the carrier comprises a pattern of grid.

27. A method of manufacturing a semiconductor device package, comprising:
- providing a carrier;
- forming a conductive layer on the carrier;
- forming a patterned passivation layer on the conductive layer;
- forming a first patterned conductive layer surrounded by the patterned passivation layer, the first patterned conductive layer having a first portion and a second portion electrically disconnected from the first portion, the first portion having a first surface adjacent to the carrier and exposed by the patterned passivation layer, and the second portion having a first surface adjacent to the carrier exposed by the patterned passivation layer; and
- making the first surface of the first portion in direct contact with an insulation medium, wherein making the first surface of the first portion in direct contact with the insulation medium further comprises changing characteristic of the conductive layer.

28. The method of claim 27, further comprising making the first surface of the second portion in direct contact with the insulation medium.

29. The method of claim 27, wherein the characteristic of the conductive layer is changed to be non-conductive.

30. The method of claim 27, wherein the characteristic of the conductive layer is changed by physical technique.

31. The method of claim 30, wherein the characteristic of the conductive layer is changed by optical technique.

32. The method of claim 30, wherein the characteristic of the conductive layer is changed by magnetic technique.

33. The method of claim 30, wherein the characteristic of the conductive layer is changed by thermal technique.

34. The method of claim 27, wherein the characteristic of the entire conductive layer is changed.

35. The method of claim 27, wherein the characteristic of a portion of the conductive layer is changed.

36. The method of claim 35, wherein the portion of the conductive layer is in direct contact with the first portion of the first patterned conductive layer.

37. The method of claim 35, wherein the portion of the conductive layer is in direct contact with the second portion of the first patterned conductive layer.

38. The method of claim 27, wherein the characteristic of a portion of the conductive layer is not changed.

39. The method of claim 38, wherein the portion of the conductive layer is in direct contact with the patterned passivation layer.

40. The method of claim 27, further comprising removing a part of the carrier.

41. The method of claim 27, further comprising removing a part of the conductive layer to form a second patterned conductive layer.

42. The method of claim 27, further comprising electrically connecting a semiconductor device to the first patterned conductive layer.

43. The method of claim 42, further comprising encapsulating the semiconductor device with encapsulant.

44. The method of claim 43, further comprising removing the carrier.

45. The method of claim 43, further comprising performing a singulation operation.

* * * * *